(12) United States Patent  (10) Patent No.: US 7,593,102 B2
Nomura  (45) Date of Patent: Sep. 22, 2009

(54) POLARIZATION EVALUATION MASK, POLARIZATION EVALUATION METHOD, AND POLARIZATION DETERMINATION DEVICE

(75) Inventor: Hiroshi Nomura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 387 days.

(21) Appl. No.: 11/605,331

(22) Filed: Nov. 29, 2006

(65) Prior Publication Data

US 2007/0127024 A1 Jun. 7, 2007

(30) Foreign Application Priority Data

Dec. 1, 2005 (JP) .............................. 2005-348244
Oct. 18, 2006 (JP) .............................. 2006-283812

(51) Int. Cl.
*G01J 4/00* (2006.01)
(52) U.S. Cl. ....................................... 356/364; 356/368
(58) Field of Classification Search ......... 356/364–368, 356/399, 401; 355/53, 55, 57; 430/5
See application file for complete search history.

(56) References Cited

U.S. PATENT DOCUMENTS

| | | | | |
|---|---|---|---|---|
| 5,459,000 | A | * | 10/1995 | Unno .............................. 430/5 |
| 5,673,103 | A | * | 9/1997 | Inoue et al. .................... 355/71 |
| 6,077,631 | A | * | 6/2000 | Unno .............................. 430/5 |
| 6,822,728 | B2 | * | 11/2004 | McCullough et al. .......... 355/53 |
| 7,072,040 | B2 | * | 7/2006 | Fukuhara ..................... 356/364 |
| 7,150,945 | B2 | | 12/2006 | Mackey |
| 7,375,799 | B2 | * | 5/2008 | Van De Kerkhof et al. .... 355/71 |

| | | | |
|---|---|---|---|
| 2004/0114150 | A1 | 6/2004 | Wegmann et al. |
| 2005/0099613 | A1 | 5/2005 | Fukuhara |
| 2005/0105087 | A1 | 5/2005 | Nomura |
| 2006/0018018 | A1 | 1/2006 | Nomura et al. |
| 2006/0192937 | A1 | 8/2006 | Kerkhof et al. |

FOREIGN PATENT DOCUMENTS

| | | |
|---|---|---|
| JP | 2005-5521 | 1/2005 |
| JP | 2005-116732 | 4/2005 |
| JP | 2005-116733 | 4/2005 |
| JP | 2005-333001 | 12/2005 |
| WO | WO 2006/078843 | 7/2006 |

OTHER PUBLICATIONS

McIntyre G et al.; "PSM Polarimetry: Monitoring Polarization at 193 nm High-NA and Immersion with Phase Shifting Masks"; Proceedings of the SPIE, vol. 5754; Bellingham, WA; May 1, 2004.

* cited by examiner

*Primary Examiner*—L. G Lauchman
(74) *Attorney, Agent, or Firm*—Finnegan, Henderson, Farabow, Garrett & Dunner, L.L.P.

(57) ABSTRACT

A polarization evaluation mask for evaluating the state of polarization of an illumination light in exposure equipment comprises a transparent substrate; a light interceptor formed in said transparent substrate and having a plurality of fine apertures; a plurality of polarizers formed to cover said plurality of fine apertures and having orientation angles of the transmissive polarization differing in increments of certain angle; and a plurality of quarter-wave plates arranged upstream of said illumination light than said polarizers and formed as superimposed on said polarizers to cover said fine apertures, and having orientation angles of the fast axis differing in increments of certain angle. Each of said plurality of fine apertures has a different combination of said orientation angle of said polarizer and said orientation angle of said quarter-wave plate.

21 Claims, 14 Drawing Sheets

POLARIZATION EVALUATION MASK, POLARIZATION EVALUATION METHOD, AND POLARIZATION DETERMINATION DEVICE

CROSS-REFERENCE TO RELATED APPLICATIONS

This application is based upon and claims the benefit of priority from the prior Japanese Patent Application No. 2005-348244, filed on Dec. 1, 2005 and the Japanese Patent Application No. 2006-283812, filed on Oct. 18, 2006, the entire contents of which are incorporated herein by reference.

BACKGROUND OF THE INVENTION

1. Field of the Invention

The present invention relates to a polarization evaluation mask for use in evaluation of the polarizing property of exposure equipment, a polarization evaluation method, and a polarization determination device for determining the polarizing property.

2. Description of the Related Art

In recent years, the so-called immersion exposure equipment has been known in the field of semiconductor exposure equipment to improve the resolution for fine patterns. In the immersion exposure equipment, a liquid is filled between the lowermost lens in a projection lens and a semiconductor substrate to realize a projection lens with a $NA \geq 1$ (NA means numerical apertures). Because of such the enlarged NA, the reduction in resolution due to polarization of illumination light has been considered as a problem. Accordingly, such a polarized illumination technology has been hastily developed that allows the state of polarization in σ of illumination light to have a special distribution. In addition, a technology has been hastily developed to evaluate the state of polarization of illumination light. A polarization evaluation requires measurements of factors such as an ellipticity of a polarized ellipse, an orientation of the principal axis of a polarized ellipse, the rotational direction of polarization (a right-handed rotation or a left-handed rotation), and a ratio of a polarized component to an unpolarized component in the total intensity (a degree of polarization). Desirably, these factors can be measured simply by the user of exposure equipment unaided without asking the exposure equipment manufacturer for help.

In response to the tendency to shorten the exposure wavelength of the exposure equipment, a calcium fluoride crystal (fluorite) or the like with a high double refraction has been used in the optical system thereof in consideration of the transmissivity. Thus, it is required to measure the magnitude of the double refraction of such the optical system quantitatively. Desirably, this can be also measured simply by the user of exposure equipment unaided without asking the exposure equipment manufacturer for help. Indication of the property of the optical system having a double refraction generally requires the use of a Jones matrix or a Mueller matrix. The Jones matrix is a matrix with 2 rows and 2 columns, which expresses the optical property of an optical element that transmits a completely polarized light expressible with a Jones vector. With amplitude $a_x$, $a_y$ and a phase difference $\delta$, the Jones vector expresses an electric field vector $(E) = (E_x, E_y)$ as follows.

$$E = \begin{pmatrix} E_x \\ E_y \end{pmatrix} = e^{i\omega t} \begin{pmatrix} a_x e^{i\varphi_x} \\ a_y e^{i\varphi_y} \end{pmatrix} = e^{i(\omega t + \varphi_x)} \begin{pmatrix} a_x \\ a_y e^{i\delta} \end{pmatrix} \quad \text{[Expression 1]}$$

If the completely polarized light expressible with such the Jones vector is subjected to any conversion when it passes through the optical element, the property of the optical element is expressed as the Jones matrix. For example, a Jones matrix for a polarizer with an orientation angle $\theta = 0°$ of the transmissive polarization can be expressed as follows.

$$P(0) = \begin{bmatrix} 1 & 0 \\ 0 & 0 \end{bmatrix} \quad \text{[Expression 2]}$$

A Jones vector can be advantageously computed in a general optical simulator using an electric field vector. Elements of the vector and the conversion matrix are expressed with complex numbers and accordingly can not be met one by one with physical quantities that are directly observable by experiment. In order to combine an actually measured value with a Jones vector, therefore, a proposed method introduces a Pauli matrix that has been used in the quantum mechanics or the like. The introduction seems to complicate the issue in contrast and reduces the significance of purposeful adoption of the Jones vector. The Jones vector supposes only the completely polarized light. Accordingly, it has a fatal defect because it can not respond to a partially polarized light that contains an unpolarized component, which is rather general as the state of polarization in the semiconductor exposure equipment.

Therefore, for expression of the double refractive property of the optical system including a fluorite lens that inevitably causes an unpolarized component, a Mueller matrix is suitable because it can treat the unpolarized component as well. The Mueller matrix is a matrix with 4 rows and 4 columns, which expresses the optical property of an optical element that transmits a partially polarized light expressible with Stokes parameters.

With $s_0$ for the total intensity of light, $s_1$ for the intensity of a 0° linear polarized component (X-axis of the Poincare sphere shown in FIG. 25), $s_2$ for the intensity of a 45° linear polarized component (Y-axis of the Poincare sphere shown in FIG. 25), and $s_3$ for the intensity of a right-handed rotational, circular polarized component (Z-axis (North pole) of the Poincare sphere shown in FIG. 25), the Stokes parameters can be expressed as follows, particularly for the completely polarized light.

$$S = \begin{pmatrix} s_0 \\ s_1 \\ s_2 \\ s_3 \end{pmatrix} = \begin{pmatrix} a_x^2 + a_y^2 \\ a_x^2 - a_y^2 \\ 2a_x a_y \cos\delta \\ 2a_x a_y \sin\delta \end{pmatrix} \quad \text{[Expression 3]}$$

On the Poincare sphere, the longitude corresponds to double the orientation angle $\theta$ of polarization, and the latitude to double the ellipticity angle $\epsilon$ (see FIG. 25). In a word, any state of polarization can be expressed by one point in a surface of the Poincare sphere.

In the Stokes parameters, $(s_0^2 - (s_1^2 + s_2^2 + s_3^2))^{1/2}$ expresses an unpolarized component. In a word, the Stokes parameters can also express the partially polarized light that also contains an unpolarized component. In other words, the magnitude of the Poincare sphere expresses the degree of the partially polarized light. In the completely polarized light, $S_0$ matches the radius of the Poincare sphere, and the larger the unpolarized component, the smaller the Poincare sphere becomes. A degree of polarization V, which is an index indicative of the extent of light polarized, can be defined as below.

$$V = \frac{\sqrt{s_1^2 + s_2^2 + s_3^2}}{s_0} \quad \text{[Expression 4]}$$

A conversion of a certain state of polarization expressed with the Stokes parameters to another state of polarization can be expressed using a Mueller matrix with 4 rows and 4 columns. For example, when a light in the state of polarization (S) is converted into another state of polarization (S') while it passes through an optical element as shown in FIG. 26A, a Mueller matrix (M) for this optical element is used to establish the following expression.

$$S' = M \cdot S \quad \text{[Expression 5]}$$

If plural optical systems are aligned serially as shown in FIG. 26B, the following expression is established.

$$S' = M_2 M_1 S \quad \text{[Expression 6]}$$

Accordingly, once the Mueller matrix for the optical element is grasped, the state of polarization after transmission can be precisely predicted through computation from the state of polarization before incidence even though any number of optical elements are stacked. For example, a Mueller matrix for a polarizer with an orientation angle θ of the transmissive polarization and a polarization intensity ratio (1:χ) can be expressed by the following expression.

$$P_\theta = \frac{1}{2}\begin{pmatrix} 1+\chi^2 & (1-\chi^2)\cos 2\theta & (1-\chi^2)\sin 2\theta & 0 \\ (1-\chi^2)\cos 2\theta & (1+\chi^2)\cos^2 2\theta + 2\chi\sin^2 2\theta & (1-\chi)^2 \sin 2\theta \cos 2\theta & 0 \\ (1-\chi^2)\sin 2\theta & (1-\chi)^2 \sin 2\theta \cos 2\theta & (1+\chi^2)\sin^2 2\theta + 2\chi\cos^2 2\theta & 0 \\ 0 & 0 & 0 & 2\chi \end{pmatrix} \quad \text{[Expression 7]}$$

A Mueller matrix for a quarter-wave plate with an orientation angle θ of the fast axis and a retardation $\Delta = \pi/2 + \delta (\delta \ll 1)$ can be expressed by the following expression.

$$Q_\theta = \begin{pmatrix} 1 & 0 & 0 & 0 \\ 0 & 1-(1-\cos\Delta)\sin^2 2\theta & (1-\cos\Delta)\sin 2\theta & -\sin\Delta\sin 2\theta \\ 0 & (1-\cos\Delta)\sin 2\theta & 1-(1-\cos\Delta)\cos^2 2\theta & \sin\Delta\cos 2\theta \\ 0 & \sin\Delta\sin 2\theta & -\sin\Delta\cos 2\theta & \cos\Delta \end{pmatrix} \quad \text{[Expression 8]}$$

$$\approx \begin{pmatrix} 1 & 0 & 0 & 0 \\ 0 & 1-(1+\delta)\sin^2 2\theta & (1+\delta)\sin 2\theta\cos 2\theta & -\sin 2\theta \\ 0 & (1+\delta)\sin 2\theta\cos 2\theta & 1-(1+\delta)\cos^2 2\theta & \cos 2\theta \\ 0 & \sin 2\theta & -\cos 2\theta & -\delta \end{pmatrix}$$

Preferably, a Mueller matrix for an optical system can also be measured simply by the user of exposure equipment unaided without asking the exposure equipment manufacturer for help. The inventors of the present application have already proposed such the exposure equipment, for example, in Patent document 1 (JP 2005/116732 A). With this equipment, the user of semiconductor exposure equipment can measure a Mueller matrix for an optical system contained inside without asking the manufacturer for help.

The equipment of Patent document 1, however, is not of the type that can measure the state of polarization of illumination light itself. Therefore, the measurement of the state of polarization of illumination light must be executed asking the exposure equipment manufacturer for help and thus there is no way to evaluate it by the user's own efforts. It is also difficult by the user's own efforts to evaluate the measurement of the state of polarization of illumination light that is transmitted through an optical system contained inside and illuminated onto a transfer substrate.

SUMMARY OF THE INVENTION

In an aspect of the invention of a polarization evaluation mask, a polarization evaluation mask for evaluating the state of polarization of an illumination light in exposure equipment comprises a transparent substrate; a light interceptor formed in the transparent substrate and having a plurality of fine apertures; a plurality of polarizers formed to cover the plurality of fine apertures and having orientation angles of the transmissive polarization differing in increments of certain angle; and a plurality of quarter-wave plates arranged upstream of the illumination light than the polarizers and formed as superimposed on the polarizers to cover the fine apertures, and having orientation angles of the fast axis differing in increments of certain angle, wherein each of the plurality of fine apertures has a different combination of the orientation angle of the polarizer and the orientation angle of the quarter-wave plate.

In another aspect of the invention of a polarization evaluation mask, a polarization evaluation mask for evaluating the state of polarization of an illumination light in exposure equipment comprises a transparent substrate; a light interceptor having fine apertures formed in a first surface of the transparent substrate; and an optical element holder configured such that orientation angles of the transmissive polarization of polarizers and orientation angles of the fast axis of quarter-wave plates arranged upstream of the illumination light than the polarizers can be arranged selectively at a plurality of discrete angles per certain angle.

In an aspect of the invention of a polarization evaluation method, a polarization evaluation method for evaluating the state of polarization of an illumination light in exposure equipment comprises arranging a mask at a position of a photomask to be used for usual exposure in the exposure equipment, instead of the photomask, in order of a quarter-wave plate, a polarizer and the mask seen from upstream of the illumination light, the mask having fine apertures covered with the quarter-wave plate and the polarizer; measuring the light intensity of light obtained by switching between an orientation angle θ1 of the transmissive polarization of the polarizer and an orientation angle θ2 of the fast axis of the quarter-wave plate per discrete angle Δθ to vary combinations of both orientation angles in a plurality of ways, and applying the mask to the illumination light per each of respective combinations; and computing Stokes parameter elements ($s_0$, $s_1$, $s_2$, $s_3$) indicative of the state of polarization of the illumination light based on the light intensity.

In an aspect of the invention of a polarization determination device, a polarization determination device for evaluating the state of polarization of an illumination light illuminated onto a transfer substrate in exposure equipment comprises a light interceptor having a plurality of fine apertures; a transparent substrate arranged upstream of the illumination light than the light interceptor and having a first spherical surface depressed about the fine aperture in a surface opposite to the light interceptor; a plurality of quarter-wave plates arranged downstream of the illumination light than the light interceptor and formed to cover the fine apertures, and having orientation angles of the fast axis differing in increments of certain angle; a plurality of polarizers arranged downstream of the illumination light than the quarter-wave plates and formed as superimposed on the quarter-wave plates to cover the plurality of fine apertures and having orientation angles of the transmissive polarization differing in increments of certain angle; and a photodetector arranged downstream of the illumination light than the polarizer to detect light transmitted through the polarizer, wherein each of the plurality of fine apertures has a different combination of the orientation angle of the polarizer and the orientation angle of the quarter-wave plate.

DETAILED DESCRIPTION OF THE INVENTION

Polarization evaluation masks, polarization evaluation methods, and polarization determination devices according to embodiments of the present invention will now be described in detail with reference to the drawings.

First Embodiment

Figure 1:
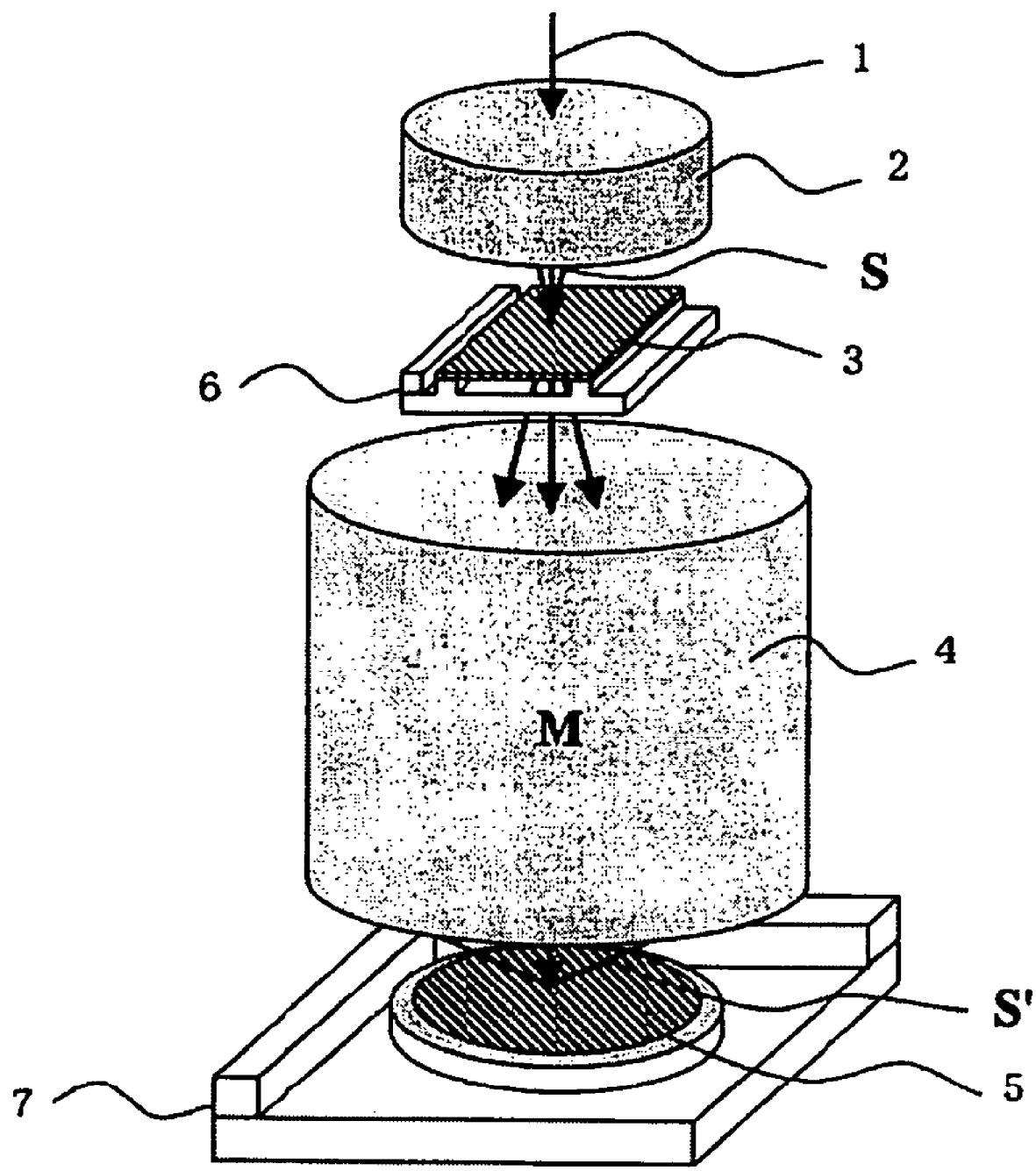
FIG. 1 schematically shows a configuration of semiconductor exposure equipment to which a polarization evaluation mask according to a first embodiment of the present invention is applicable.

FIG. 1 shows a schematic configuration of exposure equipment to which a polarization evaluation mask according to a first embodiment of the present invention is applicable. As shown in FIG. 1, in this exposure equipment, an illumination light 1 emitted from a light source unit, not shown, is converted into one having a desired brightness distribution or a state of polarization by a optical system of illumination 2 and then illuminated onto a photomask 3 mounted on a photomask stage 6. The light transmitted through the photomask 3 is projected via a projection lens 4 onto a photosensitive film-applied wafer 5 to transfer a pattern of the photomask 3 onto the wafer 5. The wafer 5 is mounted on a wafer stage 7. The polarization evaluation mask of this embodiment is a device for use in determination of the state of polarization (S) of the illumination light 1 that illuminates the photomask 3. Specifically, from the photomask stage 6 for receiving the photomask 3 mounted thereon, the photomask 3 is removed, and the polarization evaluation mask of this embodiment is mounted thereon instead. Then, an image formed on the wafer 5 is identified to determine the state of polarization (S) of the illumination light 1.

Figure 2:
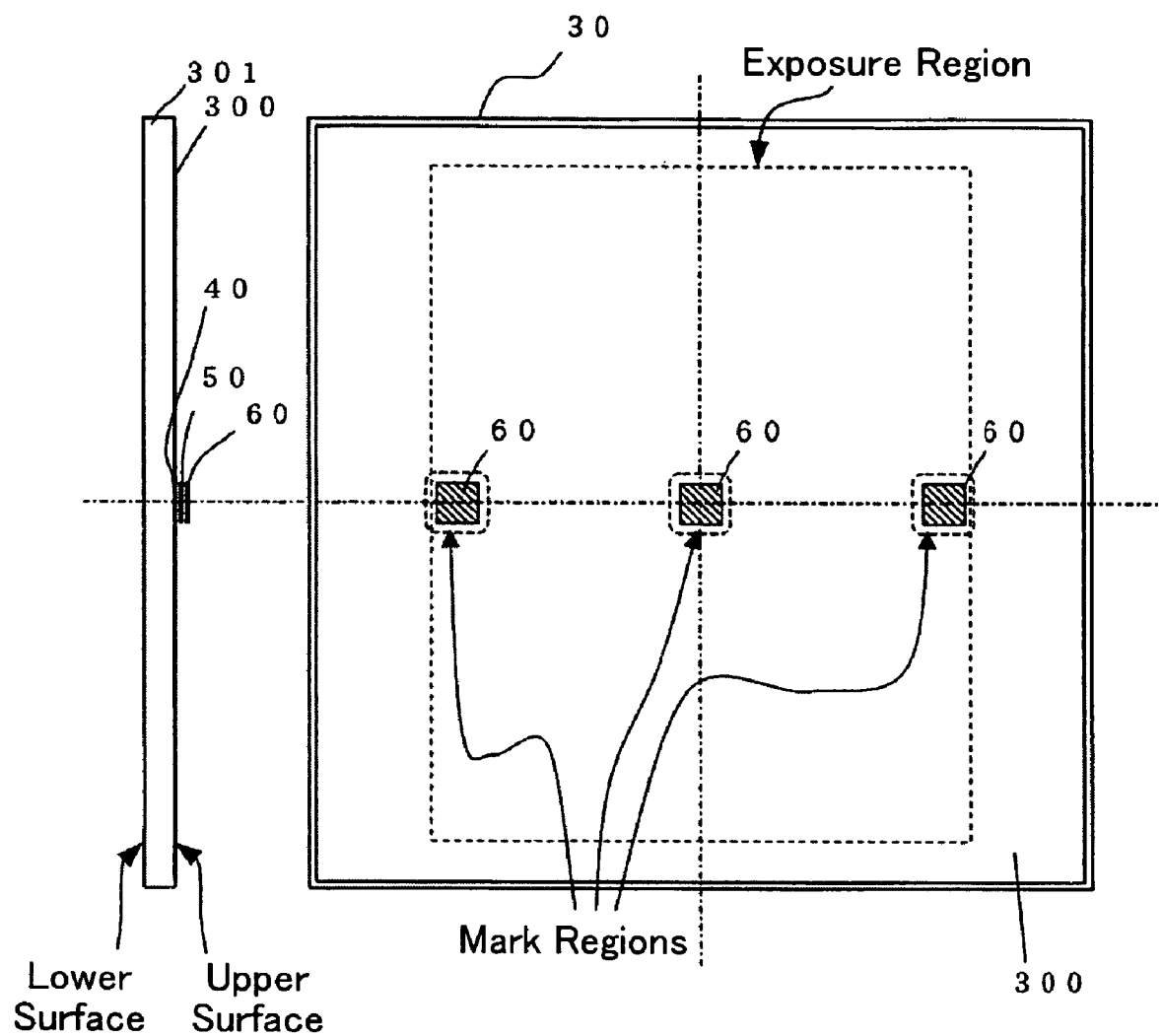
FIG. 2 schematically shows a configuration of the polarization evaluation mask 30 according to the first embodiment of the present invention.

An example of the polarization evaluation mask 30 of this embodiment is shown in FIG. 2. The polarization evaluation mask 30 includes a substrate 301 composed of transparent material, and a light interceptive film 300 formed over a surface of the substrate 301. Within an exposure region to be irradiated with the illumination light 1, plural (3 in FIG. 2) mark regions are formed, and a fine aperture pattern 40 is formed through the light interceptive film 300 in the mark region. Two kinds of optical elements 50, 60 are further arranged as superimposed on the fine aperture pattern 40. The two kinds of optical elements 50, 60 locate upstream of the illumination light 1 than the fine aperture pattern 40 (on the upper surface).

Figure 3:
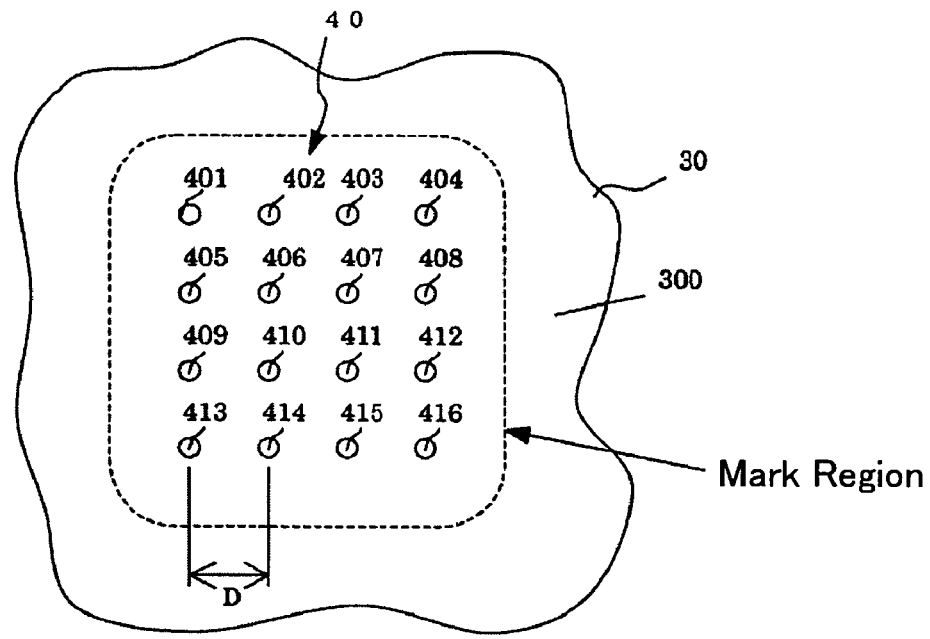
FIG. 3 shows an example of a fine aperture pattern 40 in the polarization evaluation mask 30.

The fine aperture pattern 40 formed in the mark region includes 16 fine apertures 401-416 as shown in FIG. 3, which are arranged at intervals D=3.0 mm in a square grid of 4 rows×4 columns, for example. Four fine apertures 401-404 are aligned laterally in the first row, four 405-408 laterally in the second row, four 409-412 in the third row, and four 413-416 laterally in the fourth row. Thus, the fine apertures 401-416 are arrayed in a grid. These fine apertures 401-416 are formed when circular portions are removed from the light interceptive film 300. The apertures have a diameter of 57.2 μm and all have the same shape. The shape of the fine apertures 401-416 is not always limited to be circular but may also be polygonal. The arrangement of these apertures is not limited to the above-described 4 rows×4 columns but may also be a rectangular arrangement such as 2 rows×8 columns or a staggered arrangement.

Figure 4:
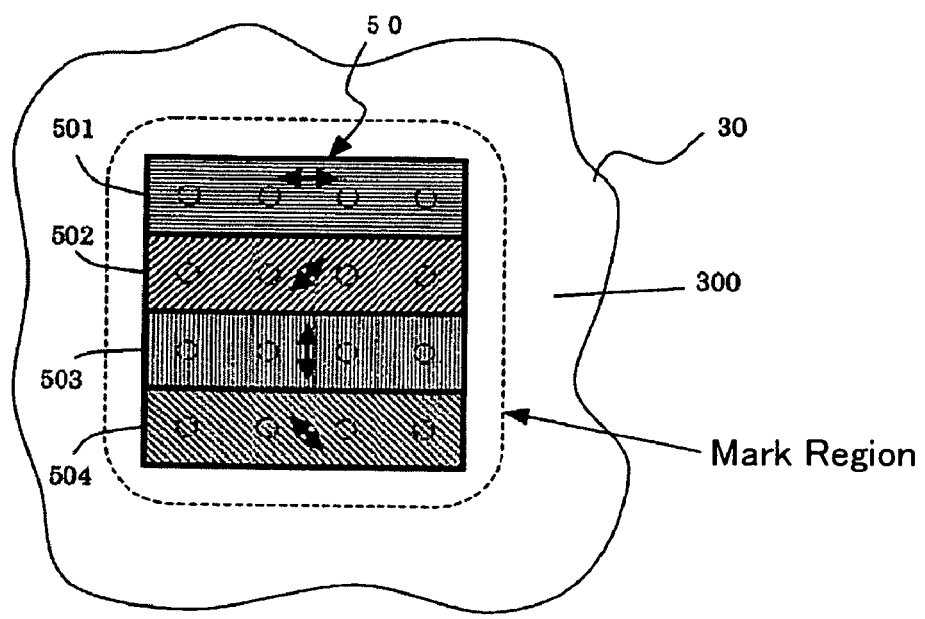
FIG. 4 shows a configuration example of an optical element 50 in the polarization evaluation mask 30.

Over these fine apertures 401-416, four thin polarizers 501-504 are arranged as shown in FIG. 4, which have orientation angles of the transmissive polarization with a 45° difference from each other. These thin polarizers 501-504 configure one optical element 50. The thin polarizers 501-504 are each shaped in a rectangle of 3 mm×12 mm with a thickness of 0.5 mm. The thin polarizers 501-504 may be made as a so-called wire grid polarizer (WGP), which has a structure including fine metal wires, or fine wires of material with a metal-like optical property relative to the wavelength of illumination light, aligned in parallel on a surface. Alternatively, they may be made as an absorptive polarizer including crystalline optical material having double refraction and photoabsorbency and sliced thin in an appropriate crystal orientation and with an appropriate thickness. Examples of the material having the metal-like optical property and used in the WGP may include a metal such as aluminum, a multi-layered carbon nanotube, and a semiconductor material such as Si and GaAs.

These four thin polarizers 501-504 are each formed to cover four fine apertures aligned in a lateral row of the fine apertures 401-416 patterned in a grid. In a word, the thin polarizer 501 with the orientation angle 0° of the transmissive polarization is arranged to cover the fine apertures 401-404 in the first row. The thin polarizer 502 with the orientation angle 45° is arranged to cover the fine apertures 405-408 in the second row. The thin polarizer 503 with the orientation angle 90° is arranged to cover the fine apertures 409-412 in the third row. The thin polarizer 504 with the orientation angle −45° is arranged to cover the fine apertures 413-416 in the fourth row.

Figure 5:
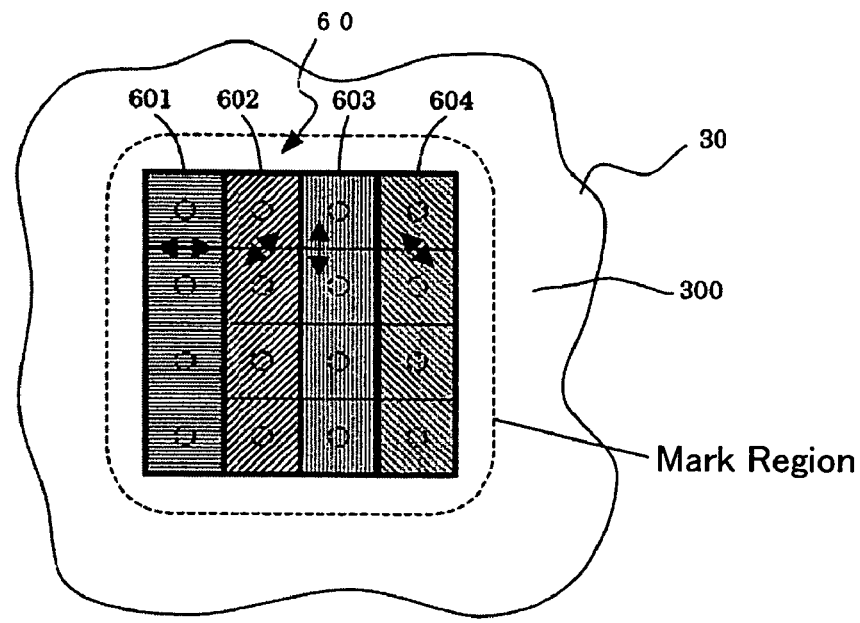
FIG. 5 shows a configuration example of an optical element 60 in the polarization evaluation mask 30.

On the thin polarizers 501-504 as shown in FIG. 5, four quarter-wave plates 601-604 are arranged having orientation angles of the fast axis with a 45° difference from one another. These four quarter-wave plates 601-604 configure the optical element 60. The four quarter-wave plates 601-604 are arranged in the longitudinal direction intersecting the thin polarizers 501-504. Each of the quarter-wave plates 601-604 is formed to cover one of four fine apertures aligned in the longitudinal column of the fine apertures 401-416 patterned in a grid. In a word, the quarter-wave plate 601 with the orientation angle 0° is arranged to cover the first column including the fine apertures 401, 405, 409, 413. The quarter-wave plate 602 with the orientation angle 45° is arranged to cover the second column including the fine apertures 402, 406, 410, 414. The quarter-wave plate 603 with the orientation angle 90° is arranged to cover the third column including the fine apertures 403, 407, 411, 415. The quarter-wave plate 604 with the orientation angle −45° is arranged to cover the fourth column including the fine apertures 404, 408, 412, 416.

The thin polarizers 501-504 and the quarter-wave plates 601-604 are arranged as described above. Thus, the fine apertures 401-416 have respective combinations of the orientation angle of the transmissive polarization of the polarizer and the orientation angle of the fast axis of the quarter-wave plate, which are all different from one another. Thus, states of polarization of lights that pass through the fine apertures 401-416 all differ from one another and, when they are specified as described bellow, the state of polarization of the illumination light 1 can be measured.

The following description is given to a method of determining the state of polarization (S) of illumination light from an image transferred onto the wafer 5, using the polarization evaluation mask 30 of this embodiment.

There are two problems herein. One is associated with the Mueller matrix (M) for the projection lens 4, which is unknown. The projection lens 4 in this case is located between the polarization evaluation mask 30 and the wafer 5 and the projection lens 4 varies the state of polarization (S'). Another is associated with the optical elements 40, 50 integrated into the polarization evaluation mask 30, which respond only to normal incidence and deteriorate the performance on oblique incidence. The illumination light 1 entering the polarization evaluation mask 30 in this case has not only normal incidence but also various angles of incidence defined by the illumination NA. The method of this embodiment makes it possible to determine the state of polarization (S), unaffected by the Mueller matrix (M) for the projection lens 4 and unaffected by errors of the optical elements 40, 50 on oblique incidence, as obvious from the following description.

Figure 6:
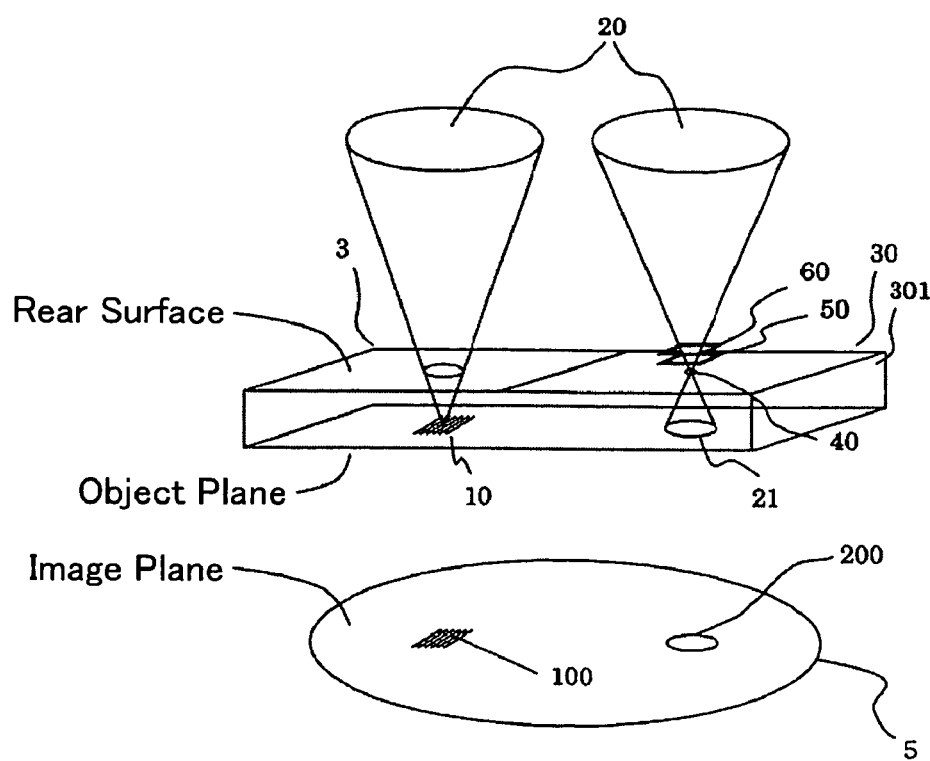
FIG. 6 illustrates methods of mounting and exposing the polarization evaluation mask 30 in comparison with a conventional photomask.

Methods of mounting and exposing the polarization evaluation mask 30 are described with reference to FIG. 6. FIG. 6 illustrates a relation between positions of the photomask 3 for usual exposure and the polarization evaluation mask 30 of this embodiment, showing exposure to the photomask 3 on the left side and exposure to the polarization evaluation mask 30 of this embodiment on the right side.

When the photomask 3 is employed to expose the wafer 5 in a usual exposure step, a mask pattern 10 locates on a lower surface of the photomask 3 or downstream of the illumination light 1. The lower surface (object plane) of the photomask 3 and an upper surface (image plane) of the wafer 5 have an optically conjugated relation with respect to the projection lens 4. Therefore, the mask pattern 10 on the lower surface of the photomask 3 is transferred onto the wafer 5 and turned into the transferred image 100.

When the polarization evaluation mask 30 of this embodiment is mounted, instead of the photomask 3, on the photomask table 6 and employed to expose the wafer 5, the pattern 40 of the fine apertures (401-416) locates on the upper surface of the substrate 301 or upstream of the illumination light 1. The pattern 40 of the fine apertures (401-416) serves as a pinhole lens and focus an image 21 of a brightness distribution 20 of the illumination light 1 on the lower surface of the substrate 301. The lower surface of the substrate 301 and the upper surface of the wafer 5 have an optically conjugated relation and transfer the image 21 of the brightness distribution on the wafer 5 as an image 200.

Figure 7:
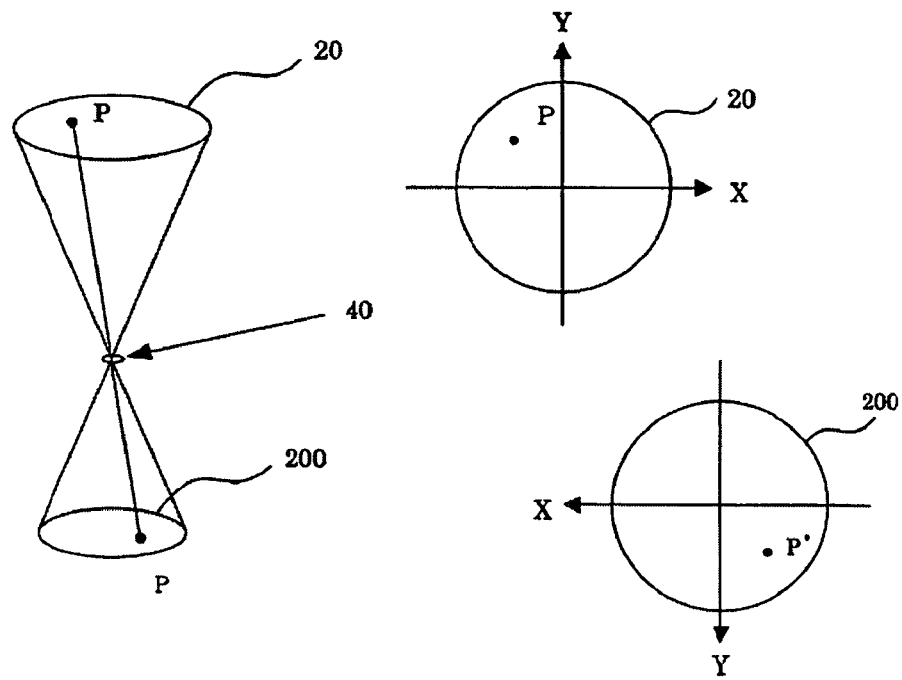
FIG. 7 illustrates a relation between a brightness distribution 20 of an illumination light 1 and an image 200 formed on a wafer 5.
Figure 8:
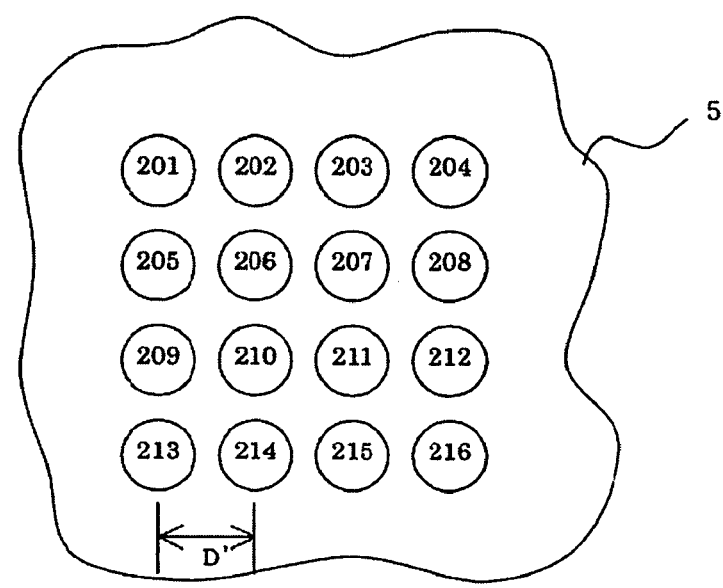
FIG. 8 depicts an example of 16 images 201-216 corresponding to fine apertures 401-416 formed on the wafer 5.

Therefore, a light beam from a point P in the brightness distribution 20 enters the fine aperture pattern 40 obliquely and reaches a point P' in the image 200 on the wafer 5 as shown in FIG. 7. An intensity distribution of the image 200 on the wafer 5 corresponds to the intensity distribution of lights that enter the polarization evaluation mask 30 at various angles and finally reach the wafer 5. The polarization evaluation mask 30 includes 16 fine apertures 401-416 arranged in each mark region and accordingly the images formed on the wafer 5 include 16 images 201-216 respectively corresponding to the fine apertures 401-416 as shown in FIG. 8. The fine apertures 401-416 have the closest distance D therebetween, which may be set at such a distance D' that prevents the images 201-216 on the wafer 5 from overlapping each other.

Figure 9:
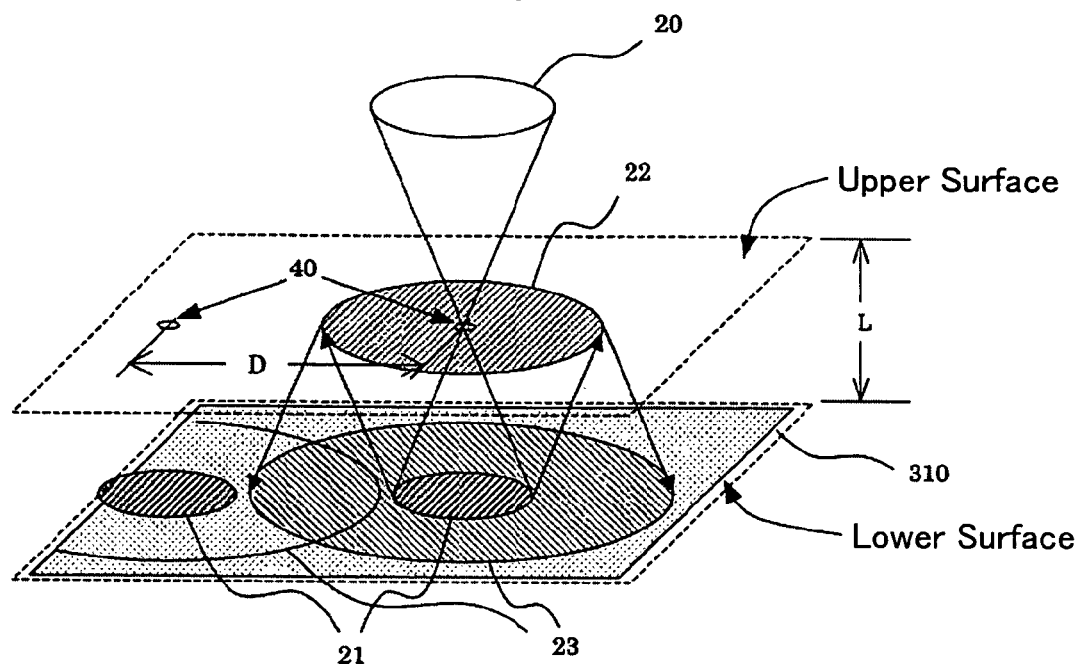
FIG. 9 illustrates an influence from reflection of light at a lower surface of a substrate 301.

For a high-precision determination, it is required to consider the reflection of light at the lower surface of the polarization evaluation mask 30. In a word, as shown in FIG. 9, the image 21 of the illumination brightness distribution on the lower surface of the substrate 301 of the polarization evaluation mask 30 is reflected at the lower surface of the mask and then reflected at the upper surface of the mask to form an image 23 having the magnitude triple the image 21 again on the lower surface of the mask. It is required to set the closest distance D between the fine apertures such that the triple image 23 can be prevented from overlapping an adjacent image. For the purpose of suppressing the intensity of the triple image 23, an antireflective film 310 is formed over the lower surface of the polarization evaluation mask 30 as shown in FIG. 9. This is effective to improve the determination precision.

The following description is given to a method of computing the state of polarization of the illumination light 1, or Stokes parameters, from the images 201-216 of the illumination light distribution. First, the Mueller matrix M for the projection lens 4 is given as follows.

$$M = \begin{pmatrix} 1 & m_{01} & m_{02} & m_{03} \\ m_{10} & m_{11} & m_{12} & m_{13} \\ m_{20} & m_{21} & m_{22} & m_{23} \\ m_{30} & m_{31} & m_{32} & m_{33} \end{pmatrix}$$ [Expression 9]

Each element ($m_{ij}$) in the Mueller matrix M is an unknown constant. In this embodiment an expression independent of each element in the Mueller matrix M is employed to express the state of polarization of the illumination light 1, or Stokes parameters. This computing method is described below in detail.

The thin polarizers 501-504 and the quarter-wave plates 601-604 in the optical elements 50 and 60 have respective orientation angles $\theta_1$ and $\theta_2$. The state of polarization of the illumination light 1, or Stokes parameters, can be represented by $(S)=(s_0, s_1, s_2, s_3)$. In this case, Stokes parameters $(S')=(s_0', s_1', s_2', s_3')$ of light entering an image sensor mounted on the position of the wafer 5 can be expressed as follows.

$$S' = M P_{\theta_1} Q_{\theta_2} S$$ [Expression 10]

In this case, the light intensity detectable at the image sensor corresponds to the parameter $s_0'$ and accordingly this is expressed hereinafter as $I(P_{\theta_1} Q_{\theta_2})$.

For example, when the orientation angles of the thin polarizers 501-504 and the quarter-wave plates 601-604 are both set at 0°, Stokes parameters can be expressed as follows.

$$S' = M P_0 Q_0 S$$ [Expression 11]

$$= \begin{pmatrix} 1 & m_{01} & m_{02} & m_{03} \\ m_{10} & m_{11} & m_{12} & m_{13} \\ m_{20} & m_{21} & m_{22} & m_{23} \\ m_{30} & m_{31} & m_{32} & m_{33} \end{pmatrix}$$

$$\frac{1}{2}\begin{pmatrix} 1+\chi^2 & 1-\chi^2 & 0 & 0 \\ 1-\chi^2 & 1+\chi^2 & 0 & 0 \\ 0 & 0 & 2\chi & 0 \\ 0 & 0 & 0 & 2\chi \end{pmatrix} \begin{pmatrix} 1 & 0 & 0 & 0 \\ 0 & 1 & 0 & 0 \\ 0 & 0 & -\delta & 1 \\ 0 & 0 & -1 & -\delta \end{pmatrix} \begin{pmatrix} s_0 \\ s_1 \\ s_2 \\ s_3 \end{pmatrix}$$

Therefore, the intensity of light received at the image sensor is represented as follows.

$$I(P_0 Q_0) =$$ [Expression 12]

$$\frac{1}{2}\{(1+\chi^2)s_0 + (1-\chi^2)s_1 + (1-\chi^2)m_{01}s_0 +$$

$$(1+\chi^2)m_{01}s_1 + 2\chi m_{02}(-\delta s_2 + s_3) +$$

$$2\chi m_{03}(-s_2 - \delta s_3)\}$$

Repetitions of such the computation for all combinations of the orientation angles (0°, 45°, 90°, −45°) of the polarizers and the orientation angles (0°, 45°, 90°, −45°) of the quarter-wave plates yield results as summarized in Table 1.

TABLE 1

| | | ¼ Wavelength plates 601-604 | | | |
|---|---|---|---|---|---|
| | | 0° | 45° | 90° | −45° |
| Polarizers 501-504 | 0° | $I(P_0 Q_0)$ | $I(P_0 Q_{45})$ | $I(P_0 Q_{90})$ | $I(P_0 Q_{-45})$ |
| | 45° | $I(P_{45} Q_0)$ | $I(P_{45} Q_{45})$ | $I(P_{45} Q_{90})$ | $I(P_{45} Q_{-45})$ |
| | 90° | $I(P_{90} Q_0)$ | $I(P_{90} Q_{45})$ | $I(P_{90} Q_{90})$ | $I(P_{90} Q_{-45})$ |
| | −45° | $I(P_{-45} Q_0)$ | $I(P_{-45} Q_{45})$ | $I(P_{-45} Q_{90})$ | $I(P_{-45} Q_{-45})$ |

In particular, the 0-degree linearly polarized component $s_1$ of the illumination light can be represented with light intensities under eight conditions indicated with the +/− marks in [Table 2], an extinction ratio $\chi$ of the polarizer and a retardation error $\delta$ of the ¼ Wavelength plate, by the following expression.

$$s_1 = \frac{\begin{array}{l}I(P_0Q_0) - I(P_0Q_{45}) + I(P_0Q_{90}) - I(P_0Q_{-45}) - \\ I(P_{90}Q_0) + I(P_{90}Q_{45}) - I(P_{90}Q_{90}) + I(P_{90}Q_{-45})\end{array}}{2(1-\chi^2)(1+\delta)}$$ [Expression 13]

TABLE 2

|  |  | ¼ Wavelength plates 601-604 | | | |
| --- | --- | --- | --- | --- | --- |
|  |  | 0° | 45° | 90° | −45° |
| Polarizers 501-504 | 0° | + | − | + | − |
|  | 45° |  |  |  |  |
|  | 90° | − | + | − | + |
|  | −45° |  |  |  |  |

Similarly, the 90° linearly polarized component $s_2$ of the illumination light can be computed from light intensities under four conditions indicated with the +/− marks in [Table 3], an extinction ratio $\chi$ of the polarizer, and a retardation error $\delta$ of the ¼ Wavelength plate, using the following expression.

$$s_2 = \frac{\begin{array}{l}I(P_{45}Q_{-45}) - I(P_{45}Q_{90}) + \\ I(P_{45}Q_{45}) - I(P_{45}Q_0) - I(P_{-45}Q_{-45}) + \\ I(P_{-45}Q_{90}) - I(P_{-45}Q_{45}) + I(P_{-45}Q_0)\end{array}}{2(1-\chi^2)(1+\delta)}$$ [Expression 14]

TABLE 3

|  |  | ¼ Wavelength plates 601-604 | | | |
| --- | --- | --- | --- | --- | --- |
|  |  | 0° | 45° | 90° | −45° |
| Polarizers 501-504 | 0° |  |  |  |  |
|  | 45° | − | + | − | + |
|  | 90° |  |  |  |  |
|  | −45° | + | − | + | − |

Furthermore, the right-handed rotational, circular polarized component $s_3$ can be computed from light intensities under four conditions indicated in [Table 4], using the following expression.

$$s_3 = \frac{I(P_{90}Q_{45}) - I(P_{90}Q_{-45}) - I(P_0Q_{45}) + I(P_0Q_{-45})}{2(1-\chi^2)}$$ [Expression 15]
$$= \frac{I(P_{45}Q_0) - I(P_{45}Q_{90}) - I(P_{-45}Q_0) + I(P_{-45}Q_{90})}{2(1-\chi^2)}$$

TABLE 4

|  |  | ¼ Wavelength plates 601-604 | | | |
| --- | --- | --- | --- | --- | --- |
|  |  | 0° | 45° | 90° | −45° |
| Polarizers 501-504 | 0° |  | (−) |  | (+) |
|  | 45° | + |  | − |  |
|  | 90° |  | (+) |  | (−) |
|  | −45° | − |  | + |  |

Thus, ($s_1$, $s_2$, $s_3$) defining the completely polarized component of the illumination light can be determined from the results of light intensity measurements under 16 conditions independent of the Mueller matrix (M) for the projection lens. It is required, however, to previously measure the incident angle dependency of the extinction rate $\chi$ of the polarizers 501-504. As the retardation error $\delta$ of the ¼ Wavelength plates 601-604 can also be computed from the determined result, it will be described later.

A comparison of the quantity of the polarized component with that of the unpolarized component in the whole intensity of illumination light requires the intensity $s_0$ of the illumination light. It is difficult to strictly compute $s_0$ from the results of the light intensity measurements under the 16 conditions but possible to compute it approximately. In a word, with the use of [Expression 16]-[Expression 19], $s_0$ can be expressed as [Expression 20].

$$A = \begin{array}{l}I(P_0Q_0) + I(P_0Q_{90}) + I(P_{45}Q_{45}) + I(P_{45}Q_{-45}) + \\ I(P_{90}Q_0) + I(P_{90}Q_{90}) + I(P_{-45}Q_{45}) + I(P_{-45}Q_{-45})\end{array}$$ [Expression 16]

$$B = \begin{array}{l}I(P_0Q_{45}) + I(P_0Q_{-45}) + I(P_{45}Q_0) + I(P_{45}Q_{90}) + \\ I(P_{90}Q_{45}) + I(P_{90}Q_{-45}) + I(P_{-45}Q_0) + I(P_{-45}Q_{90})\end{array}$$ [Expression 17]

$$a = (1+\chi^2) - 2\chi\delta$$ [Expression 18]

$$b = 2\chi - (1+\chi^2)\delta$$ [Expression 19]

$$s_0 = \frac{bA - aB}{4(1+\chi^2)(1-\chi)^2(1+\delta)} + \frac{2\chi\delta}{1+\chi^2}m_{03}s_3$$ [Expression 20]

In particular, if the retardation error $\delta$ of the quarter-wave plate is sufficiently small ($\delta \ll 1$), if the performance of the polarizing filter is excellent ($\chi \ll 1$), or if the illumination light 1 contains a high proportion of the linearly polarized component or unpolarized component and a low proportion of the circular polarized component ($|s_3| \ll 1$), the second term on the right side of [Expression 20] can be neglected, leaving the following approximation.

$$s_0 \approx \frac{bA - aB}{4(1+\chi^2)(1-\chi)^2(1+\delta)}$$ [Expression 21]

Thus, all the Stokes parameter elements ($s_0$, $s_1$, $s_2$, $s_3$) can be derived through computations under circumstances where the Mueller matrix M for the projection lens 4 is still unknown. In general, when the state of polarization is expressed using the Stokes parameters, it may be expressed not with ($s_0$, $s_1$, $s_2$, $s_3$) but with a vector having three elements ($s_1/s_0$, $s_2/s_0$, $s_3/s_0$) resulted from normalization of all elements with $s_0$.

A method of computing the above-mentioned retardation error $\delta$ is described in detail next. A previous measurement of the polarization intensity ratio $\chi$ of the polarizer is not very difficult. In contrast, measurements of the retardation error $\delta$ of the quarter-wave plate at various incident angles are very hard works. In this case, however, when C and D are used as in the following two expressions, [Expression 22] and [Expression 23], the retardation error $\delta$ can be determined as the following [Expression 24] from the results of the light intensity measurements under 16 conditions measured as described above.

$$C = I(P_0Q_0) + I(P_0Q_{90}) - I(P_{45}Q_{45}) - I(P_{45}Q_{-45}) + \quad \text{[Expression 22]}$$
$$I(P_{90}Q_0) + I(P_{90}Q_{90}) - I(P_{-45}Q_{45}) - (P_{-45}Q_{-45})$$

$$D = -I(P_0Q_{45}) - I(P_0Q_{-45}) + I(P_{45}Q_0) + I(P_{45}Q_{90}) - \quad \text{[Expression 23]}$$
$$I(P_{90}Q_{45}) - I(P_{90}Q_{-45}) + I(P_{-45}Q_0) + I(P_{-45}Q_{90})$$

$$\delta = \frac{(1+\chi^2)D - 2\chi C}{(1+\chi^2)C - 2\chi D} \quad \text{[Expression 24]}$$

Thus, in this embodiment it is possible to determine the state of polarization (S) of the illumination light that illuminates the photomask 3 precisely even if the Mueller matrix M for the projection lens 4 is unknown. The above polarization evaluation mask 30 includes the polarizers and the quarter-wave plates designed to have combinations of 45-degree different orientation angles relative to the 16 fine apertures 401-416. The present invention is not limited to this example, though, but rather the number of the fine apertures and the orientation angles can be set variously.

In the above embodiment, the closest distance D is required made larger as the maximum incident angle of the light beam entering the polarization evaluation mask 30 becomes larger. The mask structure shown in FIG. 2 may include a general photomask substrate with a thickness of 0.25 inch (L=6.4 mm). In such the case, the maximum incident angle of 15 degrees makes the image 21 have a diameter of about 2.5 mm on the lower surface of the mask 30 and requires the closest distance D of at least 3.0 mm or more. In this case, one mark region has an area of 12 mm×12 mm or more. Further, taking the influence from the triple image 23 into account, D>6.0 mm requires the mark region to have an area of 24 mm×24 mm or more. The polarization evaluation mask 30 having such the large-area mark region is not practical. Therefore, a polarization evaluation mask 30M of a variation shown in FIG. 10 exerts an effect on exposure equipment having the maximum incident angle of 10° or more.

The polarization evaluation mask 30M includes a size smaller substrate 301' with a thickness of 0.09 inch (L=2.3 mm) and a support 312 with a recess formed by excavating a generally-used photomask with a thickness of 0.25 inch, and is structured to fit the substrate 301' in the recess. The optical elements 50, 60 are embedded in the support 312.

Figure 10:
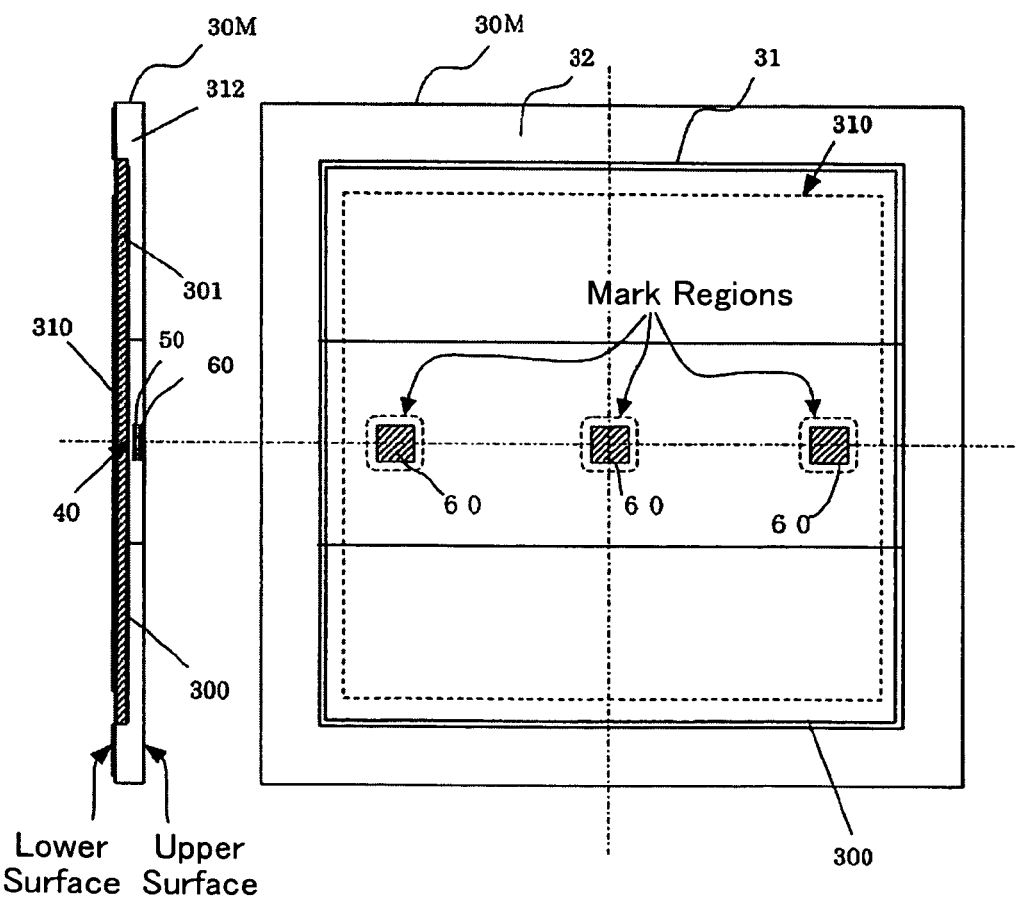
FIG. 10 shows a configuration example of a polarization evaluation mask 30M according to a variation of the first embodiment.

The use of the polarization evaluation mask 30M allows the image 21 to have a radius of about 0.95 mm on the lower surface of the mask, which is sufficient for the closest distance D=1.5 mm. If D>2.0 mm is established, the influence from the triple image 23 can be eliminated. Accordingly, the area per mark region can become a practical area. When the photomask substrate with the thickness of 0.25 inch is used as it is (FIG. 2), the diameter of the fine apertures 401-416 is equal to 57.2 μm. To the contrary, when the substrate 301' with the thickness of 0.09 inch is used as shown in FIG. 10, it is suitable to change the diameter to around 34.3 μm. These diameters are set such that the resolution of the image 21 on the lower surface of the mask 30M becomes highest.

Second Embodiment

Figure 11:
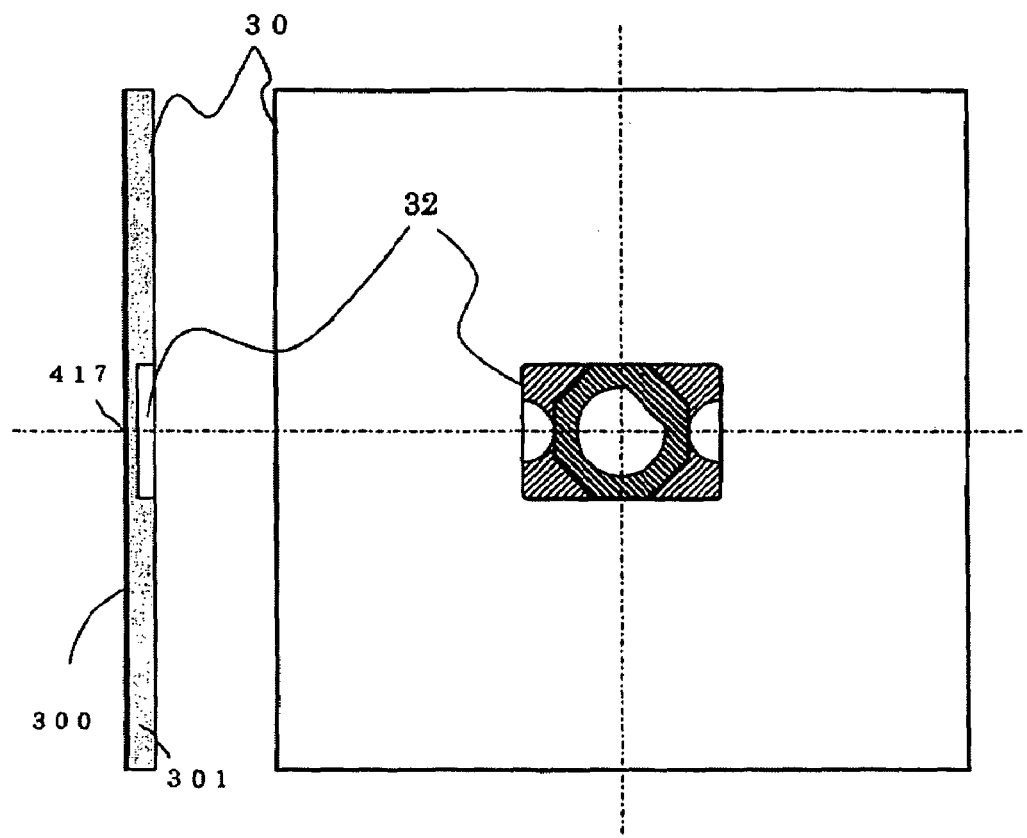
FIG. 11 schematically shows a configuration of a polarization evaluation mask 30' according to a second embodiment of the present invention.

A polarization evaluation mask 30' according to a second embodiment of the present invention is described next with reference to FIG. 11 and so forth using the same reference numerals to denote the same elements as those in the first embodiment.

The polarization evaluation mask 30' of this embodiment includes a single fine aperture 417 (around 55 μm in diameter), for example, in the vicinity of the center of a light interceptive film 300 formed on a surface of the substrate 301. In the rear surface of the substrate 301 opposite to the fine aperture 417, an around 4 mm deep recess 32 is formed. Into the recess 32, together with attachment tools 33-35 shown in FIG. 12, a thin polarizer and a quarter-wave plate are integrated having certain orientation angles. The orientation angles (attachment angles) are manually varied by a certain angle in sequence to achieve measurements similar to those in the first embodiment.

Figure 12:
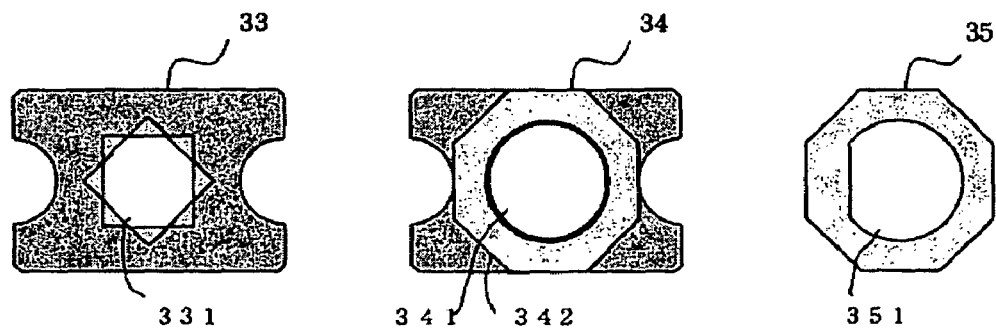
FIG. 12 shows structures of attachment tools 33-35 for use in attachment of a polarizer and a quarter-wave plate in the polarization evaluation mask 30'.

The thin polarizers and the quarter-wave plates can be rotated by 45° manually with the attachment tools 33-35 shown in FIG. 12 and attached to the polarization evaluation mask 30'. They can be secured independently to the polarization evaluation mask 30' at a plurality of selectively set discrete orientation angles (45×n° (n is an integer)).

The attachment tool 33 shown in FIG. 12 is an attachment tool for use in integration of a square thin polarizer 8 at a certain angle. It has an outside shape almost matching the recess 32 and includes an attachment frame 331 formed at the center such that the square thin polarizer 8 can vary the orientation angle on a 45-degree basis. The attachment tool 34 has an outside shape matching the recess 32 like the attachment tool 33. It includes an attachment frame 341 for fitting a quarter-wave plate 9 therein and an octagonal recess 342 for securing the attachment tool 34 therein, both formed at the center. The attachment tool 35 has an octagonal outside shape along the recess 342 for securing the quarter-wave plate 9 with the orientation angle variable by 45 degrees. In this case, the quarter-wave plate 9 is shaped in a disc with a linearly cut off part that facilitates the orientation angle to be determined from the outside shape. Such the quarter-wave plate 9 is fitted in an attachment frame 351, which is provided in the attachment tool 35.

Figure 13:
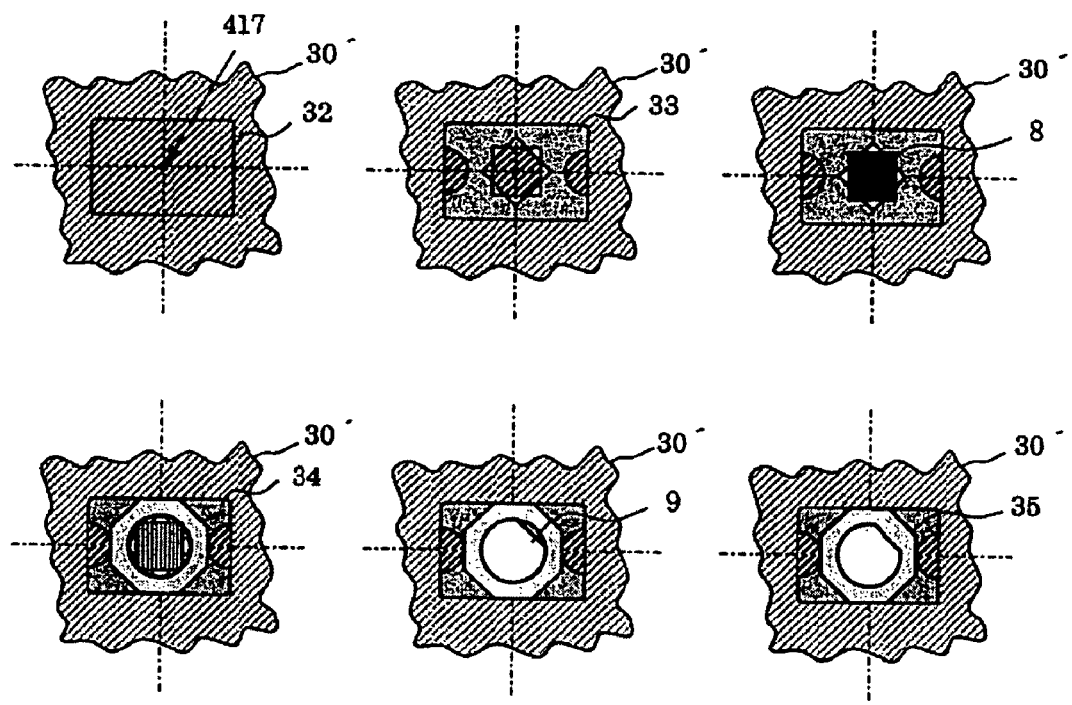
FIG. 13 shows a structure of the polarization evaluation mask 30' with the attachment tools 33-35.

FIG. 13 illustrates procedural steps of attaching the thin polarizer 8 and the quarter-wave plate 9 with the attachment tools 33-35. First, into the recess 32, the attachment tool 33 is fitted. Then, into the attachment frame 331 of the attachment tool 33, the thin polarizer 8 is fitted at an arbitrarily matched orientation angle. Subsequently, the attachment tool 34 is fitted in the recess 32 on the attachment tool 33. Then, into the attachment frame 341 of the attachment tool 34, the quarter-wave plate 9 is fitted at an arbitrarily matched orientation angle. Thereafter, the attachment tool 35 is fitted on them to fix the orientation angle of the quarter-wave plate 9. Such the procedural steps are repeated for all combinations of the 16 orientation angles like in the first embodiment while respective light intensities are measured to determine the state of polarization of the illumination light 1.

Figure 14:
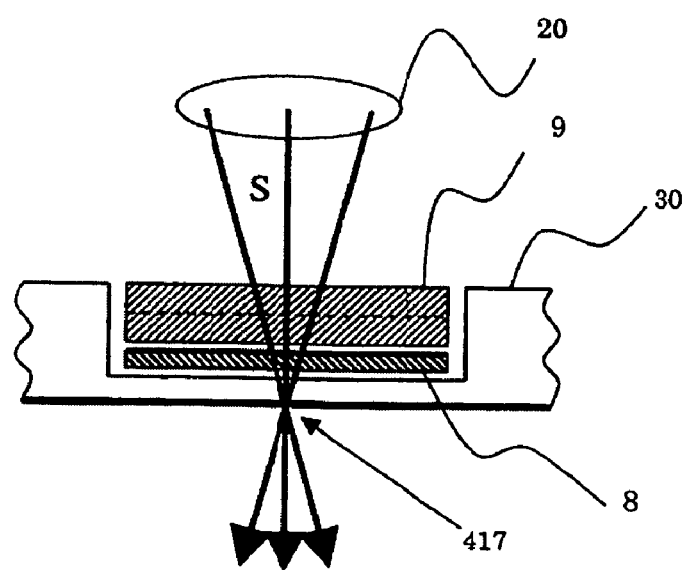
FIG. 14 schematically shows a cross-sectional view of the polarization evaluation mask 30'.

FIG. 14 schematically shows a cross-sectional view of the polarization evaluation mask 30'. The illumination light travels through the quarter-wave plate 9, the thin polarizer 8 and a fine aperture 417 in this order. In this case, the double refraction caused from the thin polarizer 8 or the substrate 301 should be prevented from affecting on determination accuracy. For that purpose, the thin polarizer 301 is arranged such that a light interceptive film formed of oriented aluminum fine wires locates upstream of the light.

Figure 15:
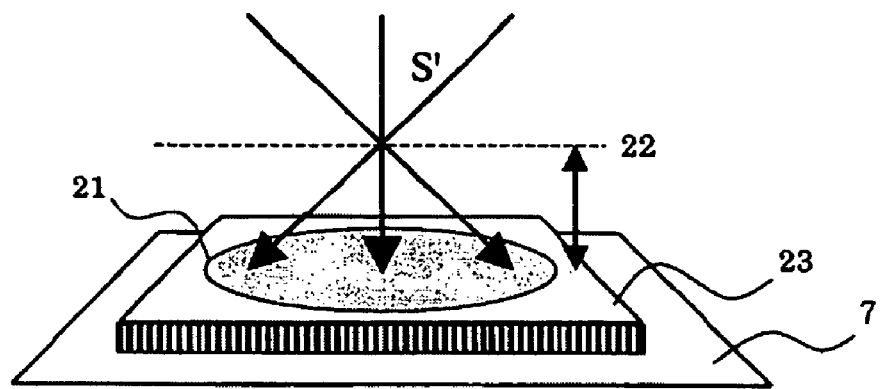
FIG. 15 illustrates a position and so forth of an image sensor 23 located for observation of an image 21.

The light transmitted through the fine aperture 417 passes through the projection lens 4 and is focused again on the image sensor 23, or a focal plane. In this case, it is suitable to arrange the image sensor 23 at an elevation off the focal plane 22 as shown in FIG. 15. As a result, in accordance with the principle of the pinhole camera, the illumination light distribution 20 can be focused as the image 21 on a photoreceptive surface of the image sensor 23.

The above description has been given to the polarization evaluation masks and the polarization evaluation methods using the polarization evaluation masks according to the first and second embodiments of the invention. The polarization evaluation masks and the polarization evaluation methods using the polarization evaluation masks of the present invention are, though, not limited to these embodiments but rather can be modified variously without departing from the scope of the invention. For example, on the ground that the optical system can be regarded as one that varies only a simple retardation, the Mueller matrix (M) for the projection lens 4 may be assumed as follows without any trouble.

$$M = \begin{pmatrix} 1 & 0 & 0 & 0 \\ m_{10} & m_{11} & m_{12} & m_{13} \\ m_{20} & m_{21} & m_{22} & m_{23} \\ m_{30} & m_{31} & m_{32} & m_{33} \end{pmatrix}$$ [Expression 25]

In such the case, the state of polarization of the illumination light 1, or the Stokes parameters, can be determined from the measured results that are less than those in the preceding embodiments, as shown below.

$$s_0 = \frac{I(P_0 Q_0) + I(P_{90} Q_0)}{1 + \chi^2}$$ [Expression 26]
$$= \frac{I(P_0 Q_0) + I(P_{90} Q_{90})}{1 + \chi^2} = \ldots$$
$$= \frac{I(P_{45} Q_{45}) + I(P_{-45} Q_{-45})}{1 + \chi^2}$$
$$= \frac{I(P_{45} Q_{-45}) + I(P_{-45} Q_{45})}{1 + \chi^2} = \ldots$$

$$s_1 = \frac{I(P_0 Q_0) - I(P_{90} Q_0)}{1 - \chi^2}$$ [Expression 27]
$$= \frac{I(P_0 Q_0) - I(P_{90} Q_{90})}{1 - \chi^2}$$
$$= \frac{I(P_0 Q_{90}) - I(P_{90} Q_0)}{1 - \chi^2}$$
$$= \frac{I(P_0 Q_{90}) - I(P_{90} Q_{90})}{1 - \chi^2}$$

$$s_2 = \frac{I(P_{45} Q_{45}) - I(P_{-45} Q_{45})}{1 - \chi^2}$$ [Expression 28]
$$= \frac{I(P_{45} Q_{45}) - I(P_{-45} Q_{-45})}{1 - \chi^2}$$
$$= \frac{I(P_{45} Q_{-45}) - I(P_{-45} Q_{45})}{1 - \chi^2}$$
$$= \frac{I(P_{45} Q_{-45}) - I(P_{-45} Q_{-45})}{1 - \chi^2}$$

$$s_3 = \frac{I(P_0 Q_{-45}) - I(P_0 Q_{45})}{1 - \chi^2}$$ [Expression 29]
$$= \frac{I(P_{45} Q_0) - I(P_{45} Q_{90})}{1 - \chi^2}$$
$$= \frac{I(P_{90} Q_{45}) - I(P_{90} Q_{-45})}{1 - \chi^2}$$
$$= \frac{I(P_{-45} Q_{90}) - I(P_{-45} Q_0)}{1 - \chi^2}.$$

Therefore, a measurement under only 6 conditions indicated with (*) in the following [Table 6] is sufficient. In the foregoing discussion, computations have been executed under the approximation that the retardation error δ of the quarter-wave plate is sufficiently small. Even if δ is too large to neglect, an additional condition indicated with (&) enables the Strokes parameters of the illumination light to be determined with sufficient precision without measuring δ previously. The combination shown herein is merely an example and is not a limiting one. With reference to [Expression 26]-[Expression 29], an optimal combination can be selected appropriately.

TABLE 5

|  |  | ¼ Wavelength plates | | | |
|---|---|---|---|---|---|
|  |  | 0° | 45° | 90° | −45° |
| Polarizers | 0° | * | * |  | * |
|  | 45° |  | * | * |  |
|  | 90° | * |  |  | & |
|  | −45° |  | * |  |  |

Figure 16:
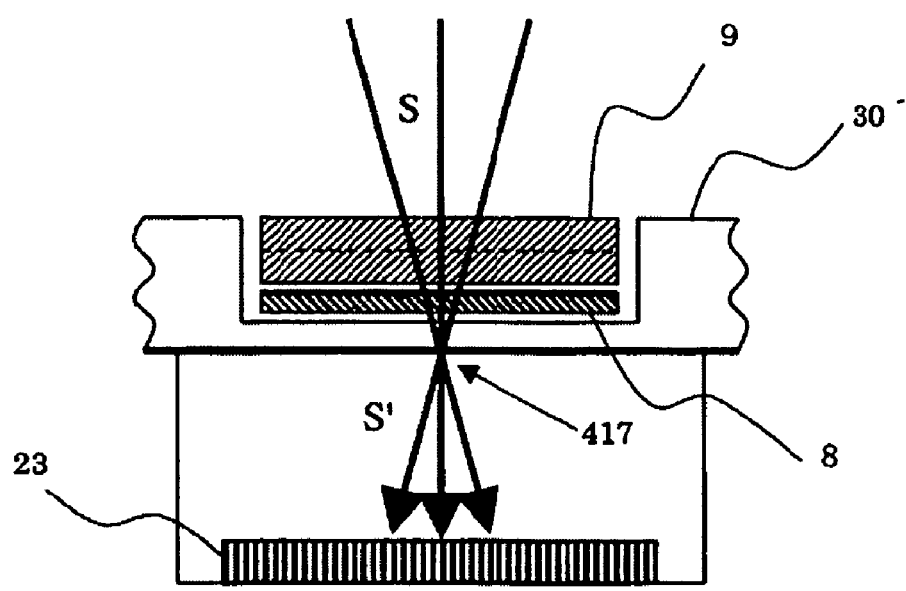
FIG. 16 illustrates another method of locating the image sensor 23.

Alternatively, the image sensor 23 can be attached downstream from the polarization evaluation mask 30 as shown in FIG. 16. This configuration enables the state of polarization of the illumination light 1 to be measured without transmitting light through the projection lens 4. Accordingly, a measurement can be made only with combinations of 6 orientation angles, like the above case.

Third Embodiment

Figure 17:
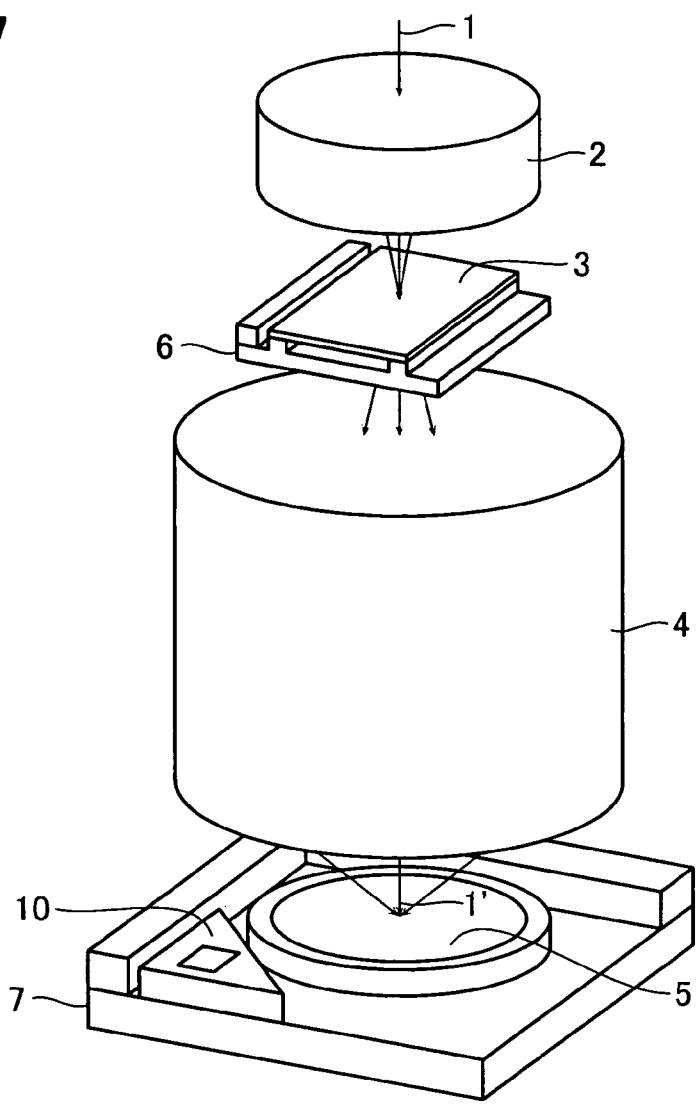
FIG. 17 schematically shows a configuration of semiconductor exposure equipment to which a polarization determination device according to a third embodiment of the present invention is applicable.

FIG. 17 shows a schematic configuration of exposure equipment to which a polarization determination device according to a third embodiment of the present invention is applicable. The same elements as those of the exposure equipment used to describe the first embodiment are given the same reference numerals and omitted from the following description.

As shown in FIG. 17, this exposure equipment is almost similar to the exposure equipment shown in FIG. 1 and different in that a determination stage 10 is provided on the wafer stage 7. The determination stage 10 can be shifted to immediately beneath the projection lens 4 to determine the state of polarization (S) of an illumination light 1' to be illuminated onto a wafer. The determination stage 10 is provided therein with a polarization determination device 10A according to the third embodiment of the present invention. The polarization determination device 10A according to the third embodiment of the present invention is particularly suitable for such a condition that a space between the projection lens 4 and the wafer 5 in the exposure equipment is filled with a liquid such as pure water. It is not particularly limited to this condition, however.

Figure 18:
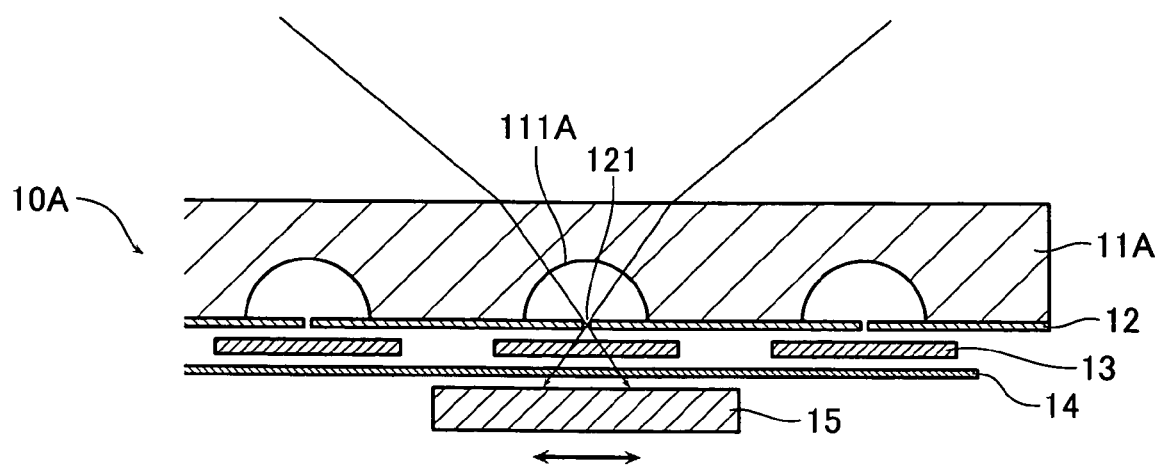
FIG. 18 schematically shows a cross-sectional view of the polarization determination device 10A according to the third embodiment of the present invention.

FIG. 18 is a cross-sectional view of the polarization determination device according to the third embodiment of the present invention. As shown in FIG. 18, the polarization determination device 10A comprises a transparent substrate 11A having a first spherical surface 111A depressed in the lower surface; a pinhole plate 12 having a pinhole (fine aperture) 121; a thin quarter-wave plate 13; a thin polarizer 14; and a photodetector 15 which be able to move in parallel relative to the polarizer 14. The transparent substrate 11A and the pinhole plate 12 are arranged so that the pinhole 121 matches the first spherical surface 111A. The polarizer 14 may be made as a so-called wire grid polarizer (WGP), which has a structure including fine metal wires, or fine wires of material with a metal-like optical property relative to the wavelength of illumination light, aligned in parallel on a surface. Alternatively, the polarizer 14 may be made as an absorptive polarizer including crystalline optical material having double refraction with a large difference in absorption coefficient at the wavelength of the illumination light and sliced thin with an appropriate thickness.

Figure 19:
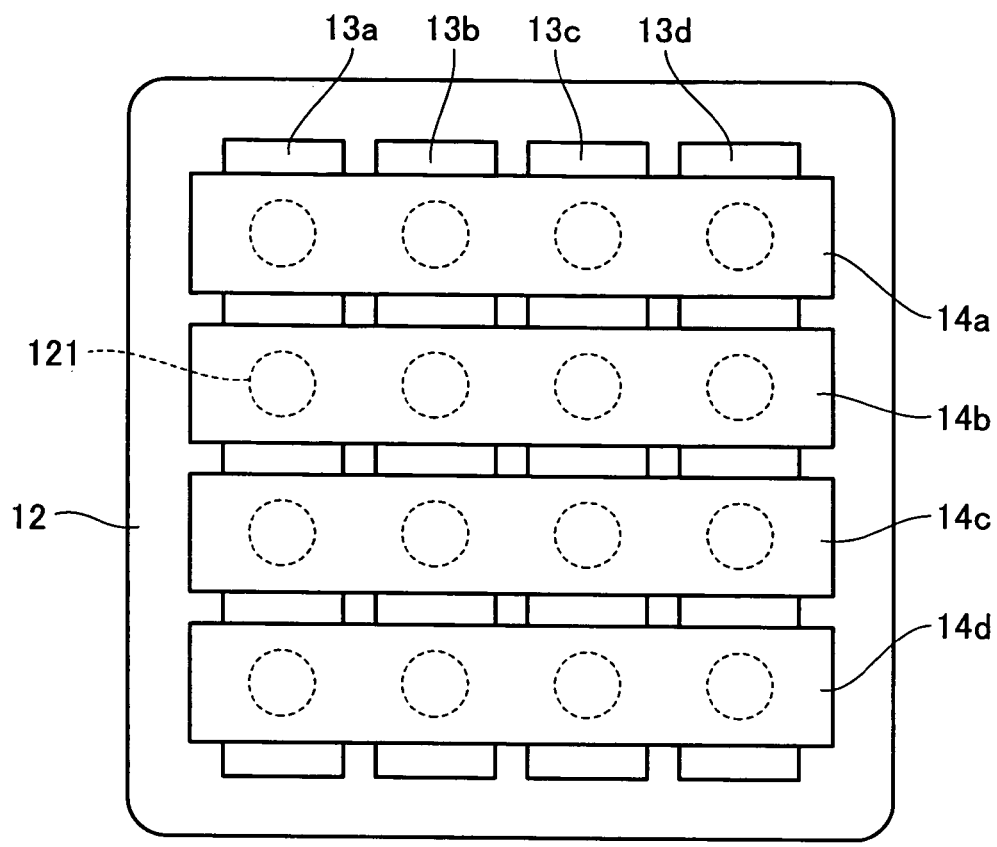
FIG. 19 schematically shows a top view of the polarization determination device 10A according to the third embodiment of the present invention.

FIG. 19 is a bottom view of the polarization determination device 10A according to the third embodiment shown in FIG. 18 from which the photodetector 15 is omitted. As shown in FIG. 19, the pinhole plate 12 includes identically shaped pinholes 121 arranged in 4 columns×4 rows at equal intervals. On one surface of the pinhole plate 12, four quarter-wave plates 13a-13d are arrayed in parallel with each other with a 45° difference of the fast axis. On the quarter-wave plates 13a-13d, four polarizers 14a-14d are arranged intersecting them at right angles. Pinholes 112 are formed at overlapped locations between the quarter-wave plates 13a-13d and the polarizers 14a-14d. Thus, different four quarter-wave plates 13a-13d and polarizers 14a-14d are arranged as above. In this case, when the intensity of transmitted light is measured on a plurality of combinations with different transmission axes, the state of polarization (S) of the illumination light can be determined as described in the first embodiment.

The shape of the pinhole 121 is not always limited to circular. For example, it may be polygonal. The arrangement of these pinholes is not limited to 4 columns×4 rows as described above but rather may be a rectangular arrangement such as 2 rows×8 columns or a staggered arrangement.

A conventional polarization determination device is described herein. The conventional polarization determination device may comprise a pinhole plate, a collimator lens, a quarter-wave plate, a polarizer, and a photodetector. The pinhole plate is provided on a position conjugately related to a wafer surface. Therefore, in the conventional polarization determination device, the maximum incident angle of light entering the wafer surface is large and accordingly the collimator lens is required to have an ultrahigh NA. The influence from the Mueller matrix for the ultra high NA collimator lens is, however, too large to neglect and can not be removed from the measured result as a problem.

To the contrary, in accordance with the polarization determination device 10A according to the third embodiment of the present invention having the above-described structure, a space between the projection lens 4 and the wafer 5 is filled with a liquid such as pure water. In this case, the refractive index above the transparent substrate 11A is n=1.44 while the refractive index in the transparent substrate 11A is n=1.56. In addition, the refractive index beneath the transparent substrate 11A is n=1.0 because the atmosphere locates there.

The transparent substrate 11A has the first spherical surface 111A in the lower surface and the pinhole 121 is arranged at the center of the first spherical surface 111A. Accordingly, the interface between the transparent substrate 11A and the atmosphere where the difference in refractive index is maximized exerts no influence on the state of polarization of light entering the quarter-wave plate 13 or the polarizer 14. Therefore, it is possible to realize a projection lens 4 with a high NA≧1.

The use of the thin quarter-wave plates 13a-13d and thin polarizers 14a-14d enables the whole structure of the polarization determination device 10A to be made thinner than a general polarization analyzer. Therefore, against the spatial restriction on exposure equipment, the range of the possibility of mounting can be expanded and, for example, the device can be mounted on the existing exposure equipment as well.

The arrangement of different four quarter-wave plates 13a-13d and polarizers 14a-14d enables all combinations required for the determination to be realized and suppresses the cost by minimizing the sum of the optical elements (to 4).

Fourth Embodiment

Figure 20:
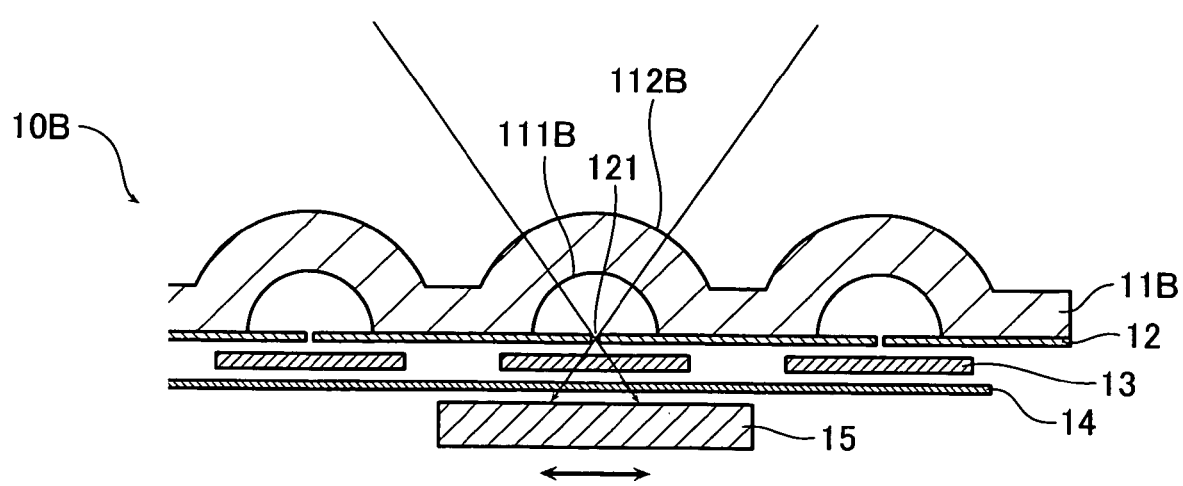
FIG. 20 schematically shows a cross-sectional view of a polarization determination device 10B according to a fourth embodiment of the present invention.

FIG. 20 is a cross-sectional view of a polarization determination device according to a fourth embodiment of the present invention. The same elements as those in the third embodiment are given the same reference numerals and omitted from the following description.

As shown in FIG. 20, in the polarization determination device 10B according to the fourth embodiment, a transparent substrate 11B is different in structure from the third embodiment.

The transparent substrate 11B has a first spherical surface 111B depressed in the lower surface and a second spherical surface 112B protruded from the upper surface. The centers of these spherical surfaces 111B, 112B are arranged so as to match the pinhole 121 of the pinhole plate 12.

The polarization determination device 10B having the transparent substrate 11B as described above can exert the same effect as the third embodiment. In addition, the polarization determination device 10B can prevent the interface between the liquid such as pure water located above the transparent substrate and the transparent substrate from affecting on the property of polarization similarly. In a word, regardless of the type of the liquid (refractive index of the liquid), the light beams transmitting through the pinhole 121 all enter the upper and lower surfaces of the transparent substrate 11B perpendicularly and imparts no variation to the state of polarization.

Fifth Embodiment

Figure 21:
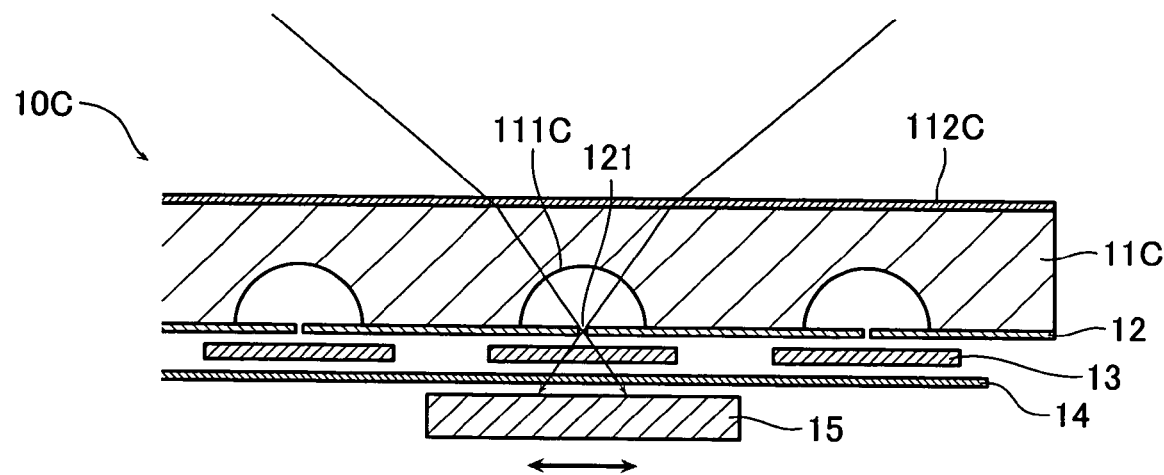
FIG. 21 schematically shows a cross-sectional view of a polarization determination device 10C according to a fifth embodiment of the present invention.

FIG. 21 is a cross-sectional view of a polarization determination device according to a fifth embodiment of the present invention. The same elements as those in the third embodiment are given the same reference numerals and omitted from the following description.

As shown in FIG. 21, in the polarization determination device 10C according to the fifth embodiment, a transparent substrate 11C is different in structure from the third embodiment.

The transparent substrate 11C has a spherical surface 11C formed depressed in the lower surface and an antireflective film 112C on the upper surface. The center of the spherical surface 111C is arranged so as to match the pinhole 121.

The antireflective film 112C can reduce the reflection-caused variation in polarization of the transmitting light. The refractive index of pure water is n=1.44 while the refractive index of the transparent substrate 11C is n=1.56, for example. The reflectance is 0.16% for the normal incidence to the transparent substrate 11C. As the incident angle approaches 90°, the reflectance becomes large, and, in the vicinity of the Brewster angle where the reflectance for the s-polarization component becomes zero, the p/s polarization intensity ratio of the transmitting light also varies. The Brewster angle is near 45° when the refractive indexes are close to each other. Therefore, setting the antireflective film 112C to minimize the reflectance for the p-polarization near the incident angle of 45° makes it possible to keep the state of polarization of the transmitting light unchanged. The polarization determination device 10C according to the fifth embodiment can exert the same effect as the third embodiment does.

Sixth Embodiment

Figure 22:
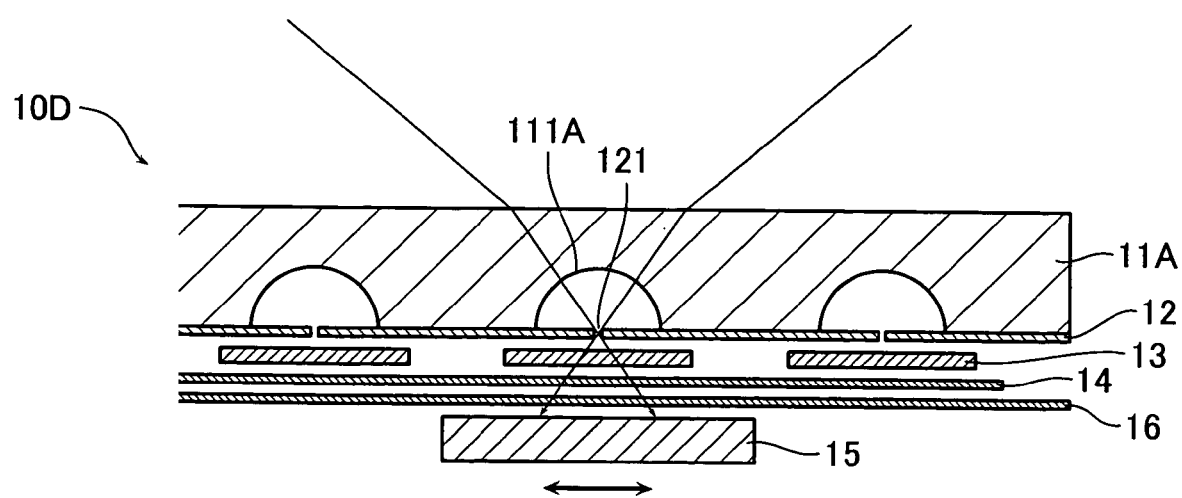
FIG. 22 schematically shows a cross-sectional view of a polarization determination device 10D according to a sixth embodiment of the present invention.

FIG. 22 is a cross-sectional view of a polarization determination device according to a sixth embodiment of the present invention. The same elements as those in the third embodiment are given the same reference numerals and omitted from the following description.

As shown in FIG. 22, the polarization determination device 10D according to the sixth embodiment further comprises a narrow band pass filter 16 provided between a polarizer 24 and the photodetector 15, different from the structure of the third embodiment.

If the polarizer 24 is an absorptive polarizer composed of crystalline optical material having double refraction and processed thin, it radiates fluorescence in response to extreme ultraviolet. This fluorescence reaches the photodetector 15 and deteriorates the determination accuracy. The narrow band pass filter 16 has a function of cutting off lights having other wavelengths than those in the vicinity of the wavelength of the exposure light. This is effective to prevent the fluorescence radiated from the absorptive polarizer from reaching the photodetector 15. The polarization determination device 10D according to the sixth embodiment can exert the same effect as the third embodiment does.

Seventh Embodiment

Figure 23:
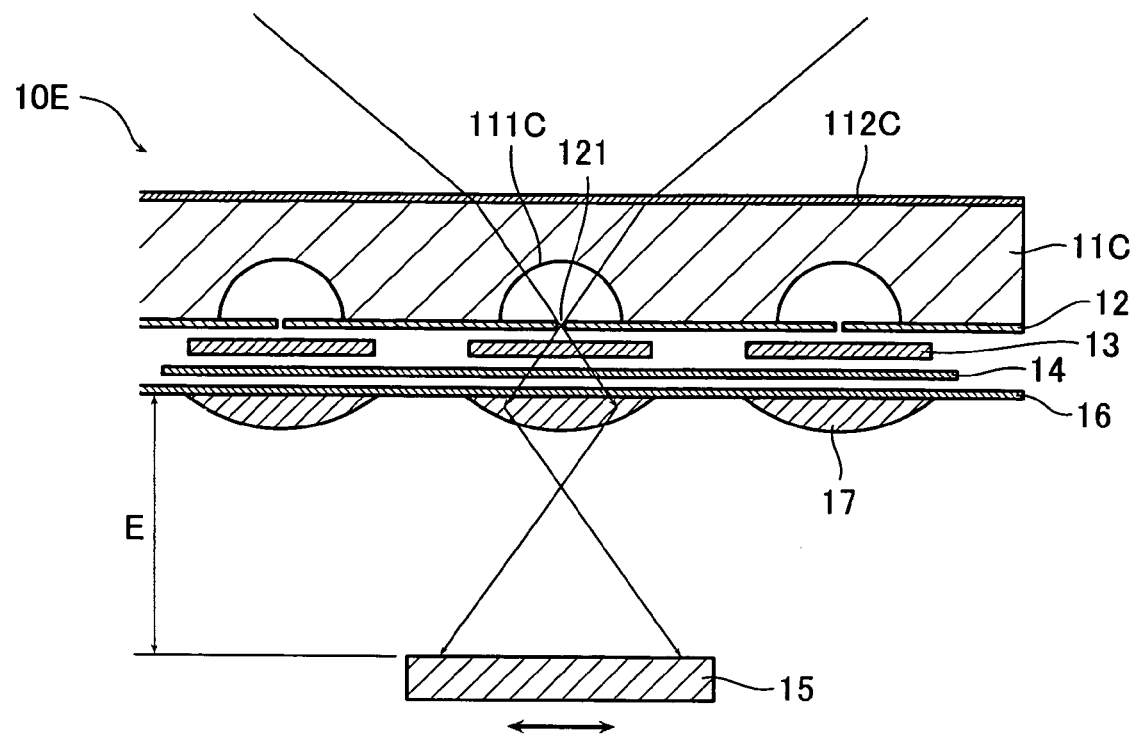
FIG. 23 schematically shows a cross-sectional view of a polarization determination device 10E according to a seventh embodiment of the present invention.

FIG. 23 is a cross-sectional view of a polarization determination device according to a seventh embodiment of the present invention. The same elements as those in the fifth embodiment are given the same reference numerals and omitted from the following description.

As shown in FIG. 23, the polarization determination device 10E according to the seventh embodiment comprises a narrow band pass filter 16 and a focusing lens 17 below the filter, in addition to the structure of the fifth embodiment. The focusing lens 17 is provided such that the central axis thereof matches the pinhole 121.

The conventional polarization determination device has a problem because lights transmitting through adjacent pinholes overlap. Then, a structure may be considered to extend the interval between the pinholes. This structure, however, requires enlargement of the quarter-wave plate and the polarizer and increases the cost of producing the polarization determination device. A shortened interval between the pinholes requires a shortened distance between the polarizer and the photoreceptive surface of the photodetector. Thus, movement of the photodetector with such the structure is difficult even for device planning. In a word, there has been a need for a large extreme ultraviolet CCD or the like, which can detect lights transmitting through all pinholes at a time.

Then, the focusing lens 17 is provided as in the above structure to allow the distance E from the narrow band pass filter 16 to the photodetector 15 to be extended, and facilitate the movement of the photodetector 15. The polarization determination device 10E according to the seventh embodiment can exert the same effect as the third embodiment does.

Eight Embodiment

Figure 24:
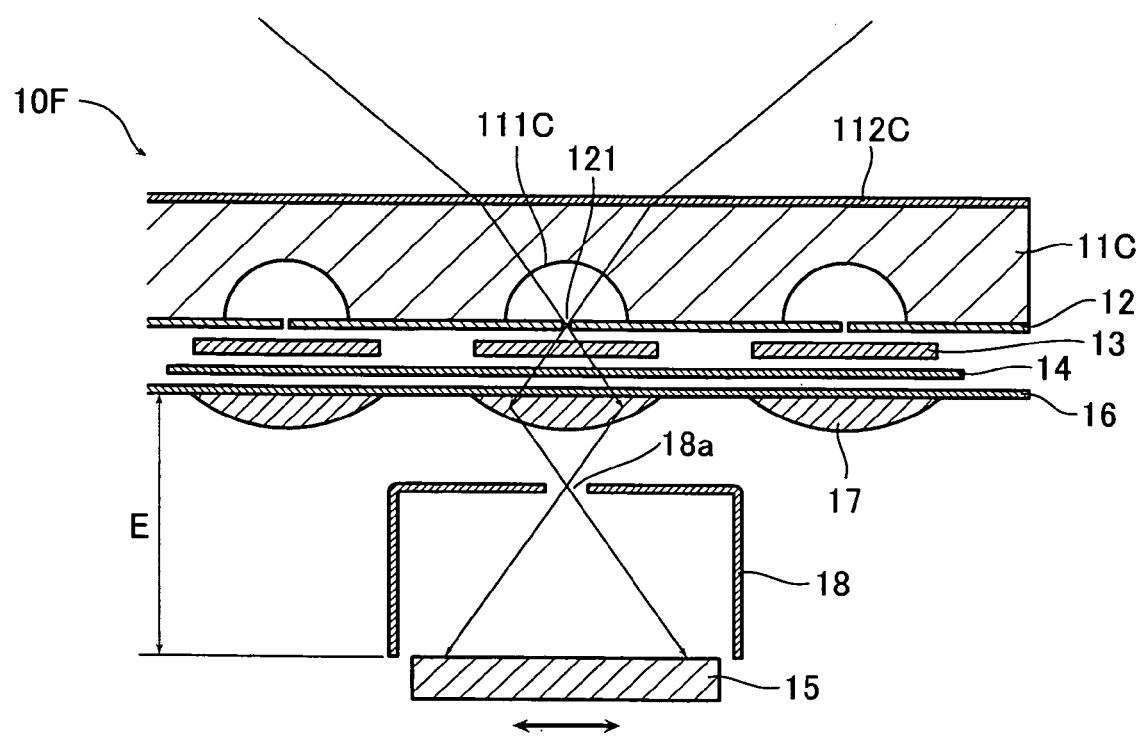
FIG. 24 schematically shows a cross-sectional view of a polarization determination device 10F according to an eighth embodiment of the present invention.
Figure 25:
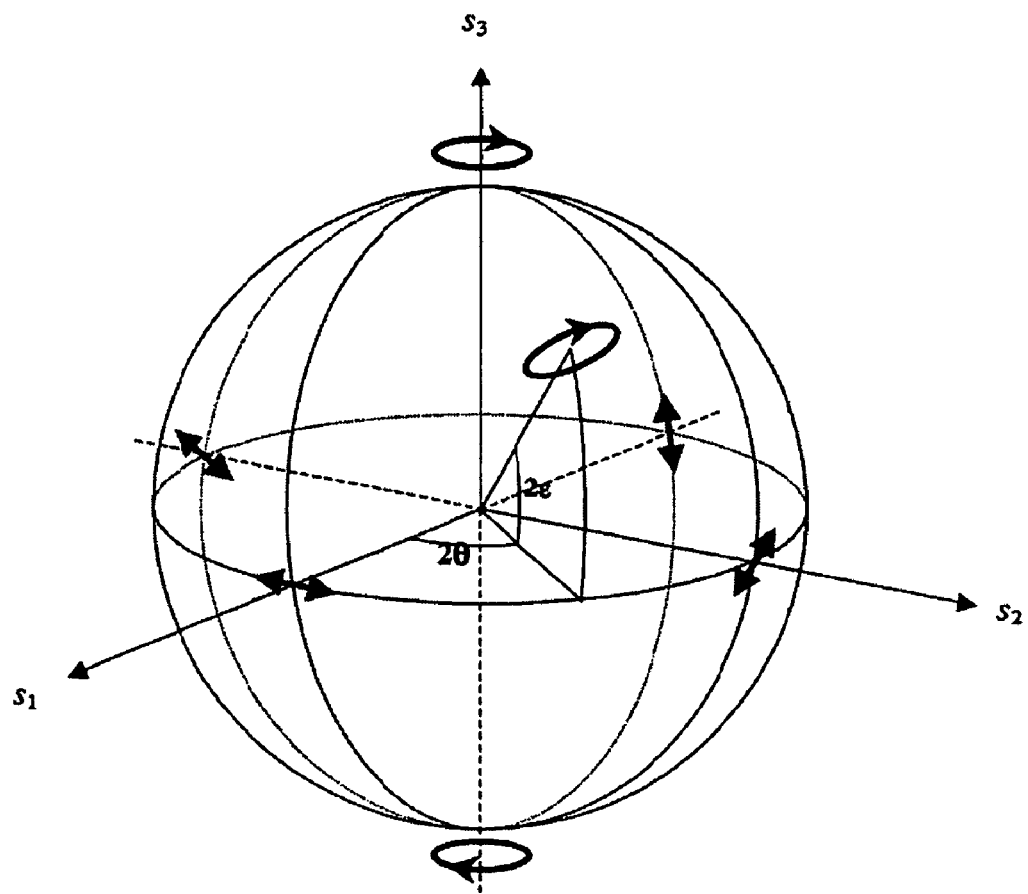
FIG. 25 is an illustrative view of a Poincare sphere.
Figure 26:
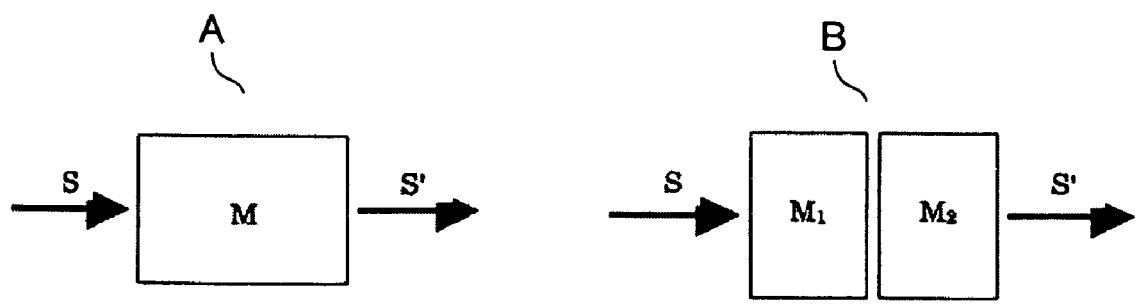
FIG. 26 shows a relation between a Mueller matrix and Stokes parameters.

FIG. 24 is a cross-sectional view of a polarization determination device according to an eighth embodiment of the present invention. The same elements as those in the seventh embodiment are given the same reference numerals and omitted from the following description.

As shown in FIG. 24, the polarization determination device 10F according to the eighth embodiment further comprises a light interceptive plate 18 having a certain sized aperture 18a provided integrally with and attached to the upper surface of the photodetector 15, different from the structure of the seventh embodiment.

The light interceptive plate 18 is provided as above to intercept the light transmitted through an adjacent pinhole 121. Accordingly, the image size on the photoreceptive surface of the detector 15 can be made larger than the interval between the pinholes 121. The polarization determination device 10F according to the eighth embodiment can exert the same effect as the third embodiment does.

What is claimed is:

1. A polarization evaluation mask for evaluating the state of polarization of an illumination light in exposure equipment, comprising:
   a transparent substrate;
   a light interceptor formed in said transparent substrate and having a plurality of fine apertures;
   a plurality of polarizers formed to cover said plurality of fine apertures and having orientation angles of the transmissive polarization differing in increments of certain angle; and
   a plurality of quarter-wave plates arranged upstream of said illumination light than said polarizers and formed as superimposed on said polarizers to cover said fine apertures, and having orientation angles of the fast axis differing in increments of certain angle,
   wherein each of said plurality of fine apertures has a different combination of said orientation angle of said polarizer and said orientation angle of said quarter-wave plate.

2. The polarization evaluation mask according to claim 1, wherein each of said fine apertures is shaped into a circle having the same diameter.

3. The polarization evaluation mask according to claim 1, wherein said fine apertures are arrayed in a grid with n rows×n columns (n is an integer),
   wherein said polarizers and said quarter-wave plates are formed almost rectangular to cover either said n rows or n columns, wherein said orientation angle is made different from each other in said rows or columns.

4. The polarization evaluation mask according to claim 1, wherein the number of said fine apertures is equal to 16, wherein said orientation angles of the transmissive polarization of said polarizers and said orientation angles of the fast axis of said quarter-wave plates include 4 types of orientation angles with a 45° difference from one another.

5. The polarization evaluation mask according to claim 1, further comprising an antireflective film formed on a surface of said transparent substrate downstream of said illumination light.

6. A polarization evaluation mask for evaluating the state of polarization of an illumination light in exposure equipment, comprising:
   a transparent substrate;
   a light interceptor having fine apertures formed in a first surface of said transparent substrate; and
   an optical element holder configured such that orientation angles of the transmissive polarization of polarizers and orientation angles of the fast axis of quarter-wave plates arranged upstream of said illumination light than said polarizers are arranged selectively at a plurality of discrete angles per certain angle.

7. The polarization evaluation mask according to claim 6, wherein said transparent substrate has a recess in a depressed shape dented in a second surface opposite to said first surface,
   wherein said optical element holder has a shape along the shape of said recess and includes a mounting frame along the shapes of said polarizer and said quarter-wave plate,
   wherein said mounting frame is configured such that orientation angles of the transmissive polarization of polarizers and orientation angles of the fast axis of quarter-wave plates are arranged selectively at a plurality of discrete angles per certain angle.

8. A polarization evaluation method for evaluating the state of polarization of an illumination light in exposure equipment, comprising:
   arranging a mask at a position of a photomask to be used for usual exposure in said exposure equipment, instead of said photomask, in order of a quarter-wave plate, a polarizer and said mask seen from upstream of said illumination light, said mask having fine apertures covered with said quarter-wave plate and said polarizer;
   measuring the light intensity of light obtained by switching an orientation angle θ1 of the transmissive polarization of said polarizer and an orientation angle θ2 of the fast axis of said quarter-wave plate per discrete angle Δθ to vary combinations of both orientation angles in a plurality of ways, and applying said mask to said illumination light per each of respective combinations; and
   computing Stokes parameter elements ($S_0$, $S_1$, $S_2$, $s_3$) indicative of the state of polarization of said illumination light based on said light intensity.

9. The polarization evaluation method according to claim 8, wherein said orientation angles of said polarizer and said quarter-wave plate are set at angles with a discrete angle Δθ=45° difference from one another.

10. The polarization evaluation method according to claim 8, wherein said orientation angles of said polarizer and said quarter-wave plate are set at angles of 4 types with a discrete angular difference of Δθ=45° from one another to set a total of 16 combinations of orientation angles, wherein said light intensity is measured in respective combinations.

11. The polarization evaluation method according to claim 10, wherein said light intensity is measured at a position further downstream of a projection lens located downstream of said mask.

12. The polarization evaluation method according to claim 8, wherein said light intensity is measured at a position further downstream of a projection lens located downstream of said mask, said projection lens operative to vary only the retardation,
   wherein said orientation angles of said polarizer and said quarter-wave plate are set at angles of 4 types with a discrete angle Δθ=45° difference from one another to set a total of 16 combinations of orientation angles,
   wherein said light intensity is measured in 6 combinations of said total of 16 combinations of orientation angles.

13. The polarization evaluation method according to claim 8, wherein said light intensity is measured using an imaging device located at a position further downstream of a projection lens located downstream of said mask.

14. The polarization evaluation method according to claim 8, wherein said light intensity is measured using a photosensitive substrate located at a position further downstream of a projection lens located downstream of said mask.

15. The polarization evaluation method according to claim 8, wherein said light intensity is measured at a position between said mask and a projection lens located downstream of said mask,
   wherein said orientation angles of said polarizer and said quarter-wave plate are set at angles of 4 types with a discrete angular difference of Δθ=45° from one another to set a total of 16 combinations of orientation angles,
   wherein said light intensity is measured in 6 combinations of said total of 16 combinations of orientation angles.

16. A polarization determination device for evaluating the state of polarization of an illumination light illuminated onto a transfer substrate in exposure equipment, comprising:
   a light interceptor having a plurality of fine apertures;
   a transparent substrate arranged upstream of said illumination light than said light interceptor and having a first spherical surface depressed about said fine aperture in a surface opposite to said light interceptor;
   a plurality of quarter-wave plates arranged downstream of said illumination light than said light interceptor and formed to cover said fine apertures, and having orientation angles of the fast axis differing in increments of certain angle;
   a plurality of polarizers arranged downstream of said illumination light than said quarter-wave plates and formed as superimposed on said quarter-wave plates to cover said plurality of fine apertures, and having orientation angles of the transmissive polarization differing in increments of certain angle; and
   a photodetector arranged downstream of said illumination light than said polarizer to detect light transmitted through said polarizer,
   wherein each of said plurality of fine apertures has a different combination of said orientation angle of said polarizer and said orientation angle of said quarter-wave plate.

17. The polarization determination device according to claim 16, wherein said transparent substrate has in a surface upstream of said illumination light a second spherical surface protruded about said fine aperture.

18. The polarization determination device according to claim 16, wherein said transparent substrate has in a surface upstream of said illumination light an antireflective film against said illumination light.

19. The polarization determination device according to claim 16, further comprising a narrow band pass filter provided between said polarizer and said photodetector to transmit light with wavelengths only in the vicinity of the wavelength of said illumination light.

20. The polarization determination device according to claim 16, further comprising an optical lens provided between said polarizer and said photodetector to determine the optical path for light transmitted through said polarizer.

21. The polarization determination device according to claim 16, further comprising a light interceptive member provided in a surface upstream of said illumination light than said photodetector and having an aperture operative to transmit said illumination light only transmitted through a specific one of said fine apertures and intercept said illumination light transmitted through others of said fine apertures.

* * * * *